(12) United States Patent
Kaneko et al.

(10) Patent No.: US 11,515,119 B2
(45) Date of Patent: Nov. 29, 2022

(54) PLASMA PROCESSING DEVICE

(71) Applicant: Y.A.C. TECHNOLOGIES CO., LTD., Tokyo (JP)

(72) Inventors: Hirofumi Kaneko, Tokyo (JP); Takeshi Noguchi, Tokyo (JP); Tatsuya Sato, Tokyo (JP)

(73) Assignee: Y.A.C. TECHNOLOGIES CO., LTD., Tokyo (JP)

( * ) Notice: Subject to any disclaimer, the term of this patent is extended or adjusted under 35 U.S.C. 154(b) by 0 days.

(21) Appl. No.: 17/261,959

(22) PCT Filed: Jul. 17, 2019

(86) PCT No.: PCT/JP2019/028086
§ 371 (c)(1),
(2) Date: Jan. 21, 2021

(87) PCT Pub. No.: WO2020/022141
PCT Pub. Date: Jan. 30, 2020

(65) Prior Publication Data
US 2021/0296083 A1    Sep. 23, 2021

(30) Foreign Application Priority Data
Jul. 26, 2018   (JP) .............................. JP2018-140650

(51) Int. Cl.
*H01J 37/32*   (2006.01)
*H01J 37/18*   (2006.01)

(52) U.S. Cl.
CPC ........... *H01J 37/18* (2013.01); *H01J 37/3211* (2013.01); *H01J 37/3244* (2013.01); *H01J 37/32183* (2013.01); *H01J 37/32568* (2013.01)

(58) Field of Classification Search
CPC ............... H01J 37/3211; H01J 37/3244; H01J 37/32027; H01J 37/32183; H01J 37/32357; H01J 37/32568
See application file for complete search history.

(56) References Cited

U.S. PATENT DOCUMENTS

2010/0269980 A1   1/2010   Nishimura et al.
2010/1026998     1/2010   Nishimura et al.
(Continued)

FOREIGN PATENT DOCUMENTS

JP   2002-151492 A1   5/2002
JP   2004-031566      1/2004
(Continued)

OTHER PUBLICATIONS

PCT Search Report and Written Opinion prepared for PCT/JP2019/028086, completed Sep. 30, 2019.
(Continued)

*Primary Examiner* — Tung X Le
(74) *Attorney, Agent, or Firm* — Barnes & Thornburg LLP

(57) ABSTRACT

The present invention provides a plasma processing device including a vacuum container that has controllable internal pressure, gas supply means, an electrode that is provided in the vacuum container and has an upper surface on which a substrate is placed, and an antenna that is arranged to face the electrode to form inductive coupling, in which the antenna that is configured to form the inductive coupling includes one end connected to a high-frequency power source via a matching circuit, and the other end that is an open end, a length of the antenna is less than ½λ of a wavelength (λ) of an RF frequency, an impedance adjustment circuit connected in parallel to the antenna is connected to an RF feeding side of the antenna, and a reactance component of a combined impedance by the impedance (Continued)

adjustment circuit is adjustable from a capacitive load to an inductive load with respect to the RF frequency supplied to the antenna.

6 Claims, 17 Drawing Sheets

(56) References Cited

U.S. PATENT DOCUMENTS

| | | | | |
|---|---|---|---|---|
| 2011/0108194 | A1* | 5/2011 | Yoshioka | H01J 37/3211 156/345.35 |
| 2011/0132540 | A1* | 6/2011 | Sakka | H01L 21/67069 156/345.3 |
| 2012/0014532 | A1 | 6/2012 | Gushiken et al. | |
| 2012/0145322 | A1 | 6/2012 | Gushiken et al. | |
| 2012/0247679 | A1* | 10/2012 | Yamazawa | H01J 37/3244 156/345.48 |
| 2013/0087288 | A1* | 4/2013 | Sakka | H01J 37/3211 156/345.48 |
| 2013/0264014 | A1 | 10/2013 | Iizuka | |
| 2014/0361690 | A1* | 12/2014 | Yamada | H01J 37/32174 315/111.21 |
| 2016/0012606 | A1 | 5/2016 | Yamawaku et al. | |
| 2016/0126064 | A1 | 5/2016 | Yamawaku et al. | |
| 2016/0126065 | A1* | 5/2016 | Yamawaku | H01J 37/321 156/345.28 |
| 2018/0061681 | A1* | 3/2018 | Koshimizu | H01J 37/32027 |

FOREIGN PATENT DOCUMENTS

| | | |
|---|---|---|
| JP | 4080793 B1 | 4/2008 |
| JP | 2010-135298 | 6/2010 |
| JP | 2010-258324 A1 | 11/2010 |
| JP | 2012-129222 A1 | 7/2012 |
| JP | 2013-105664 A1 | 5/2013 |
| JP | 5399151 B1 | 1/2014 |
| JP | 2016-091829 A1 | 5/2016 |
| TW | I555446 A1 | 10/2016 |
| WO | WO2010/073532 | 7/2010 |

OTHER PUBLICATIONS

Taiwan Search Report issued for Application No. 108126084, dated Oct. 6, 2022.

* cited by examiner

FIG. 9A
FIG. 9B
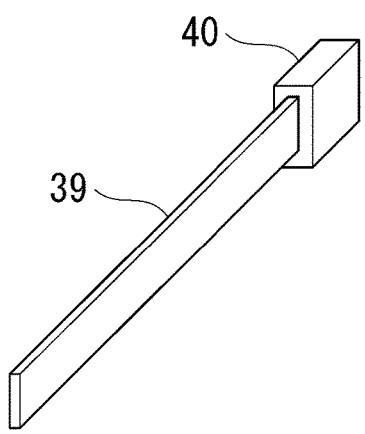
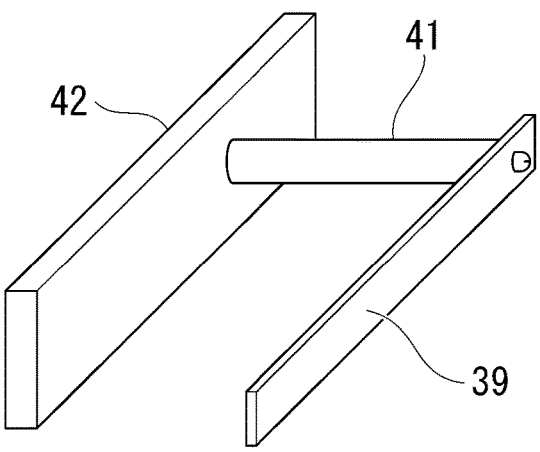
FIG. 10
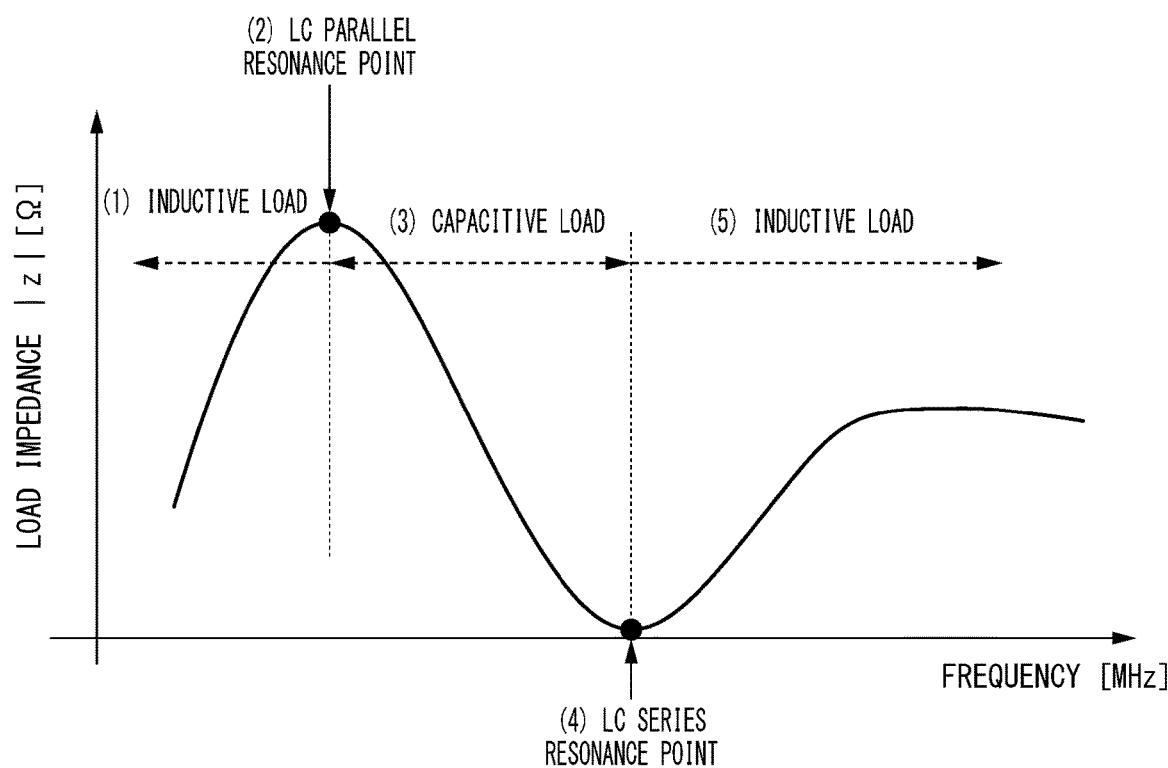

PLASMA PROCESSING DEVICE

TECHNICAL FIELD

The present invention relates to a plasma processing device.

This application is the U.S. national phase of PCT/JP2019/028086, filed on Jul. 17, 2019, which claims the benefit of priority to Japanese Patent Application No. 2018-140650, filed on Jul. 26, 2018, the entire disclosures of both of which are incorporated herein by reference.

BACKGROUND ART

In recent years, when a Flat Panel Display (FPD), such as a Liquid Crystal Display (LCD) or an Organic EL Display (OLED), is manufactured and predetermined plasma processing is performed on a substrate, such as a glass substrate, there is a high need for a plasma processing device capable of processing a large area substrate along with an increase in the size of the substrate. In addition, when processing, such as plasma etching or plasma film formation, is performed on the substrate, the density of plasma to be generated is low in a capacitively coupled plasma processing device according to the related art, and, accordingly, the etching rate and the film forming speed are low, so that there are problems in that processing time becomes long and manufacturing line costs increase due to deterioration in productivity and an increase in the number of devices.

In order to solve the problems, a plasma processing device using an Inductively Coupled Plasma (ICP) capable of generating high-density plasma is effective. However, along with an increase in the area of the substrate to be processed, in an inductive coupling type plasma processing device, there are the following requirements for the device.

(1) A high-density plasma generation mechanism capable of generating higher density plasma.

(2) A high-density plasma generation mechanism capable of generating uniform plasma over a large area.

(3) A high-density plasma generation mechanism capable of freely adjusting the in-plane distribution of plasma in the large area. (4) A high-density plasma processing device capable of, even in a case where high-frequency power (RF power) becomes high power, suppressing the RF potential of an ICP generation antenna coil to be low, suppressing abrasion due to ion attack from plasma of a dielectric window under the antenna, and reducing the generation amount of foreign matters (particles) generated due to the ion attack of the dielectric window.

(5) A high-density plasma processing device capable of stably discharging with respect to various plasma processing applications and easily adjusting intensity and density distribution of the plasma with respect to various plasma processing conditions.

With respect to the requirements with respect to the plasma processing device, it is difficult for the plasma processing device according to the related art to overcome all of the problems.

CITATION LIST

Patent Literature

[Patent Document 1]
 Japanese Patent No. 4080793
[Patent Document 2]
 Japanese Patent No. 5399151
[Patent Document 3]
 Japanese Unexamined Patent Application, First Publication No. 2013-105664

SUMMARY OF INVENTION

Technical Problem

With respect to the above-described requirements with respect to the plasma processing device, Patent Document 1 discloses an assembly antenna including an antenna coil on a plane, in which a plurality of coils are arranged in parallel, and one or more capacitors connected in series to each other.

However, in the plasma processing device, when a larger capacity high-frequency power (RF power) is applied along with an increase in a substrate size, it is not possible to sufficiently decrease a potential of a feeding portion of the antenna coil, so that it is not possible to sufficiently suppress the abrasion of the dielectric window under the antenna due to ion attack from plasma and generation of the foreign matters, which are described in (4).

In addition, while the higher density plasma described in (1) is required, there is a limit in the densification of the density of the plasma in an antenna structure.

A technique disclosed in Patent Document 2 is a plasma processing device including an antenna circuit that forms inductive coupling in a processing chamber, and a parallel circuit that is connected in parallel to the antenna circuit, in which the impedance of the antenna circuit and the impedance of the parallel circuit are reversed in phase, so that it is possible to adjust the distribution of the plasma.

However, in the technique disclosed in Patent Document 2, there is no description of an effect on an increase in the potential of the antenna feeding portion described in (4) of the requirements with respect to the plasma processing device. In addition, when the antenna circuit and the parallel circuit are in a state close to parallel resonance, the RF potential of the antenna feeding portion increases, so that a concern is supposed that ion attack from the plasma to the dielectric window increases due to the increase in the antenna potential and the foreign matters (particles) generated by the ion attack increase.

In addition, a structure is not provided in which it is possible to freely adjust the in-plane distribution of the plasma over a large area described in (3) of the requirements.

In addition, when an antenna end is connected to GND via a capacitor or is connected to the GND as it is and the length of the antenna increases, the inductance (L component) of the antenna increases. Therefore, it is necessary to increase the RF potential of the antenna feeding portion and to increase a reactance component (C component) of the circuit parallel to the antenna circuit (to decrease capacitance in a case of the capacitor). In such a case, since the adjustment range of the impedance of the antenna and the parallel circuit becomes narrow, it is presumed that it is difficult to freely adjust the plasma distribution in the large area.

Patent Document 3 discloses an antenna circuit including a parallel resonance capacitor circuit provided in parallel to each of a plurality of division antennas, in which a load is brought into a parallel resonance state. According to Patent Document 3, the circuit is capable of reducing a current value flowing through a matching circuit to suppress heat generation of the matching circuit and to improve power efficiency of an inductive coupling type plasma processing device.

However, even in a technique disclosed in Patent Document 3, there is no description of the effect on the increase in the potential of the antenna feeding portion described in (4) of the requirement with respect to the plasma processing device. In addition, when the antenna circuit and the parallel circuit are in a state close to parallel resonance, the RF potential of the antenna feeding portion increases, so that a concern is supposed that the ion attack from the plasma to the dielectric window increases due to the increase in the antenna potential and the foreign matters (particles) generated by the ion attack increase.

The present invention is made in view of the above circumstances, and an object of the present invention is to provide a plasma processing device in which an electric potential of an antenna feeding portion is low, it is possible to suppress generation of foreign matters, it is possible to realize high-density plasma, controllability of an in-plane distribution of plasma processing is excellent, and it is possible to perform plasma processing over a large area.

Solution to Problem

In order to achieve the above object, the present invention uses the following configuration.

In a first aspect, a plasma processing device according to the present invention is a plasma processing device including: a vacuum container that has controllable internal pressure; a lower electrode that is provided in the vacuum container and has an upper surface on which a substrate is placed; and an antenna that is arranged to face the lower electrode to form inductive coupling, in which the antenna that is configured to form the inductive coupling includes one end which is connected to a high-frequency power source for supplying high-frequency power via a matching circuit, and the other end which is an open end, a length of the antenna is less than ½λ of a wavelength (λ) of an RF frequency, an impedance adjustment circuit parallel to the antenna is connected to a high-frequency power feeding side of the antenna, and a reactance component of a combined impedance by the impedance adjustment circuit is adjustable from a capacitive load to an inductive load with respect to the RF frequency supplied to the antenna.

In the plasma processing device, when one end of the antenna inductively coupled to the lower electrode is connected to the high-frequency power source via the matching circuit and the other end is set to the open end, it is possible to reduce the RF potential at the antenna feeding portion, for example, to be equal to or less than approximately ⅓ or the like, as compared with a structure, in which the other end of the antenna is grounded via the capacitor, according to the related art. Therefore, it is possible to reduce an oscillating electric field radiated from the antenna, to suppress the abrasion of the dielectric window due to the ion attack from the plasma, and to suppress the generation of the foreign matters (particles) caused by the ion attack.

In the plasma processing device, impedance adjustment means is provided which is capable of adjusting the reactance component of the combined impedance from the capacitive load to the inductive load, so that it is possible to adjust the amount of RF current flowing through an antenna. Therefore, it is possible to adjust the density and strength of the plasma. When the impedance adjustment circuit parallel to the antenna is used, it is possible to generate the higher density plasma and to generate uniform plasma over a large area.

In a second aspect of the present invention, it is preferable that the impedance adjustment circuit is a variable capacitor, and the plasma processing device is configured to freely adjust the plasma distribution and the plasma density by optimizing capacitance of the variable capacitor according to an application to be used, and adjusting the combined impedance of the impedance adjustment circuit with respect to the RF frequency supplied to the antenna.

When the variable capacitor is used, it is possible to easily adjust the plasma distribution and the plasma density with respect to various plasma processing conditions according to the application to be used.

In a third aspect of the present invention, it is preferable that the antenna that is configured to form the inductive coupling is a spiral-shaped coil antenna, and the number of turns thereof is at least two turns or more.

When the antenna is a spiral-shaped coil antenna, coupling between the antenna and the plasma becomes strong as compared with an antenna having a general comb shape, a ladder shape, and a crank shape, so that it is possible to generate the higher density plasma.

In addition, the number of turns of the coil antenna has a relationship which is proportional to a magnetic field intensity H from Equation (1) of the magnetic field intensity H radiated from the antenna below. As the number of turns increases, the magnetic field intensity radiated from the coil antenna becomes stronger, so that it is possible to generate high-density plasma.

[Equation 1]

$$H = \frac{na^2 I}{2(a^2 + x^2)^{3/2}} \qquad \text{Equation (1)}$$

In the Equation (1), I represents a current (instantaneous value) flowing through the coil antenna, a represents a radius of the coil antenna, x represents a distance from a center, and n represents the number of turns of the coil antenna, respectively.

In a fourth aspect of the present invention, it is preferable that a part of an open end side of the antenna is covered by an insulator for preventing aerial discharge (arcing) due to an increase in electric potential or is supported by a nearby structure via the insulator.

When one end of the antenna is set to the open end and high RF power is applied due to an increase in the RF potential, there is a problem in that aerial discharge (arcing) is generated. When the open end of the antenna is covered with an insulator or supported by the insulator, it is possible to prevent the aerial discharge (arcing).

In a fifth aspect, a plasma processing device according to the present invention including: a vacuum container that has controllable internal pressure; a lower electrode that is provided in the vacuum container and has an upper surface on which a substrate is placed; and an antenna that is arranged to face the lower electrode to form inductive coupling, in which the antenna is an assembly antenna in which a plurality of antenna elements are assembled, each including one end which is connected to a high-frequency power source for supplying high-frequency power via a matching circuit, and the other end which is an open end, a length of the antenna is less than ½λ of a wavelength (λ) of an RF frequency, an RF power distribution path is provided for distributing and supplying RF power between the matching circuit and the plurality of antennas, an impedance adjustment circuit parallel to the antenna is connected in parallel to at least one or more antennas between the RF power distribution path and a high-frequency power feeding side of each antenna, and a reactance component of a combined impedance by the antennas or the antenna group and the impedance matching circuit is adjustable by the impedance adjustment circuit from a capacitive load to an inductive load with respect to the RF frequency supplied to the antennas or the antenna group.

In the plasma processing device, when one end of the antenna or the antenna group inductively coupled to the lower electrode is connected to the high-frequency power source via the matching circuit and the other end is set to the open end, it is possible to reduce the RF potential at the antenna feeding portion, for example, to be equal to or less than approximately ⅓ or the like, as compared with a structure, in which the other end of the antenna is grounded via the capacitor, according to the related art. Therefore, it is possible to suppress the abrasion of the dielectric window due to the ion attack from the plasma and to suppress the generation of foreign matters (particles) caused by the ion attack.

In the plasma processing device, impedance adjustment means is provided which is capable of adjusting the reactance component of the combined impedance from the capacitive load to the inductive load, so that it is possible to adjust the amount of RF current flowing through an antenna. Therefore, it is possible to adjust the density and strength of the plasma. When an assembly antenna in which a plurality of antenna elements are assembled is used, it is possible to provide a high-density plasma generation mechanism capable of generating uniform plasma over a large area.

When the impedance adjustment circuit parallel to the antenna is used, it is possible to generate the higher density plasma and to generate uniform plasma over a large area.

In addition, it is possible to provide the plasma processing device capable of freely adjusting an in-plane distribution of the plasma by forming an antenna from a plurality of antenna groups.

In a sixth aspect of the present invention, it is preferable that the impedance adjustment circuit is a variable capacitor, and the plasma processing device is configured to freely adjust a plasma distribution and a plasma density by optimizing capacitance of the variable capacitor according to an application to be used, and adjusting the combined impedance of the impedance adjustment circuit with respect to the RF frequency supplied to the antenna.

When the variable capacitor is used, it is possible to easily adjust the plasma distribution and the plasma density with respect to various plasma processing conditions according to the application to be used.

In a seventh aspect of the present invention, it is preferable that the antenna that is configured to form the inductive coupling is a spiral-shaped antenna coil, and the number of turns thereof is at least two turns or more.

When the antenna is a spiral-shaped coil antenna, coupling between the antenna and the plasma becomes strong as compared with an antenna having a general comb shape, a ladder shape, and a crank shape, so that it is possible to generate higher density plasma.

In addition, the number of turns of the coil antenna has a relationship which is proportional to a magnetic field intensity H from Equation (1) of the magnetic field intensity H radiated from the antenna shown above. As the number of turns increases, the magnetic field intensity radiated from the coil antenna becomes stronger, so that it is possible to generate a high-density plasma.

In an eight aspect, it is preferable that a part of an open end side of the antenna is covered by an insulator for preventing aerial discharge (arcing) due to an increase in electric potential or is supported by a nearby structure via the insulator.

When one end of the antenna is set to the open end and high RF power is applied due to an increase in the RF potential, there is a problem in that aerial discharge (arcing) is generated. When the open end of the antenna is covered with an insulator or supported by the insulator, it is possible to prevent the aerial discharge (arcing).

In a ninth aspect, in the present invention, it is preferable to further include an ammeter that measures an RF current flowing through each antenna in a middle of a path from an RF feeding portion of each antenna of the antenna group to an open end portion, and it is preferable that an in-plane distribution of a plasma density is controllable by freely adjusting the impedance of the impedance adjustment circuit based on the current value flowing through the antenna and adjusting the current value flowing through the antenna.

Since it is possible to adjust the impedance of the impedance adjustment circuit connected in parallel to the antenna from the current value of the antenna, it is possible to secure reproducibility of plasma distribution adjustment and to reduce adjustment time. In addition, when a defect occurs in any of the antennas of the antenna group or any of the control mechanism of the impedance adjustment circuit, the defect is detected instantly, the plasma processing of the substrate is interrupted, and an alarm is issued, so that it is possible to prevent processing failure on the substrate in advance.

In a tenth aspect of the present invention, it is preferable that adjustment of the impedance adjustment circuit is settable in each processing step of a processing recipe for performing plasma processing, and is settable by setting a parameter of an impedance adjustment value in which a value of an arbitrary impedance adjustment circuit is set in advance.

When performing the plasma processing, it is possible to provide the plasma processing device which can select an optimum plasma distribution or the plasma intensity in each processing step by using parameter setting of the impedance adjustment value in which a value of an arbitrary impedance adjustment circuit is set in advance. As a result, it is possible to simply adjust the plasma intensity and the density distribution for various plasma processing applications.

In an eleventh aspect of the present invention, it is preferable that the matching circuit includes an inverted L-type matching circuit or a T-type matching circuit, which is suited to respond to a change from the capacitive load to the inductive load with respect to the RF frequency used by the reactance component of the combined impedance.

It is possible to cover a matching range from an impedance of a capacitive load to an impedance of an inductive load by an inverted L-type matching circuit or a T-type matching circuit, thereby being applied to the plasma processing device of the embodiment.

Advantageous Effects of Invention

According to the plasma processing device of the present invention, as compared with the inductive coupling type plasma processing device according to the related art, it is possible to generate a higher density plasma, it is possible to freely adjust an in-plane distribution of the plasma even over a large area. Even in a case where high-frequency power becomes high power, it is possible to suppress an RF potential of an antenna coil to be low, to suppress abrasion due to ion attack from plasma of a dielectric window under the antenna, and to suppress the generation of foreign matters (particles).

Also, the present invention is not limited to a plasma etching device or an ashing device, and can be widely applied to another plasma processing device such as CVD film forming device.

BRIEF DESCRIPTION OF DRAWINGS

FIG. 9A is perspective view showing a first example representing a structure for preventing aerial discharge (arcing) of another end portion (open end) of a coil antenna.

FIG. 9B is a perspective view showing a second example representing a structure for preventing aerial discharge (arcing) of another end portion (open end) of a coil antenna.

FIG. 10 is a graph showing a change in a load side combined impedance with respect to an RF frequency in a plasma processing device according to Example 1 of the present invention.

DESCRIPTION OF EMBODIMENTS

First Embodiment

Each embodiment of a plasma processing device of the present invention will be described with reference to the accompanying drawings.

Figure 1:
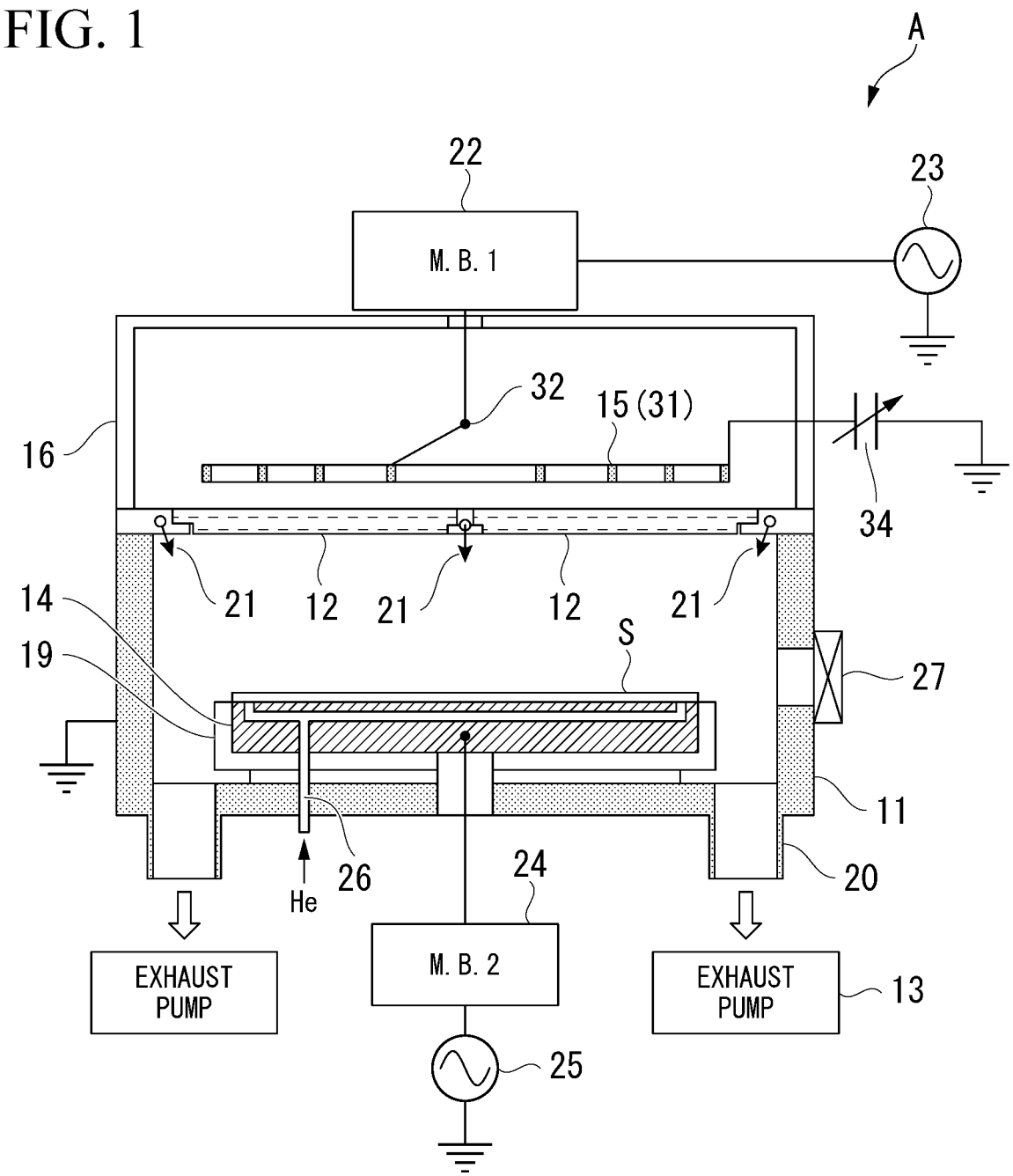
FIG. 1 is a cross-sectional view showing an inductive coupling type plasma processing device according to the related art.
Figure 2:
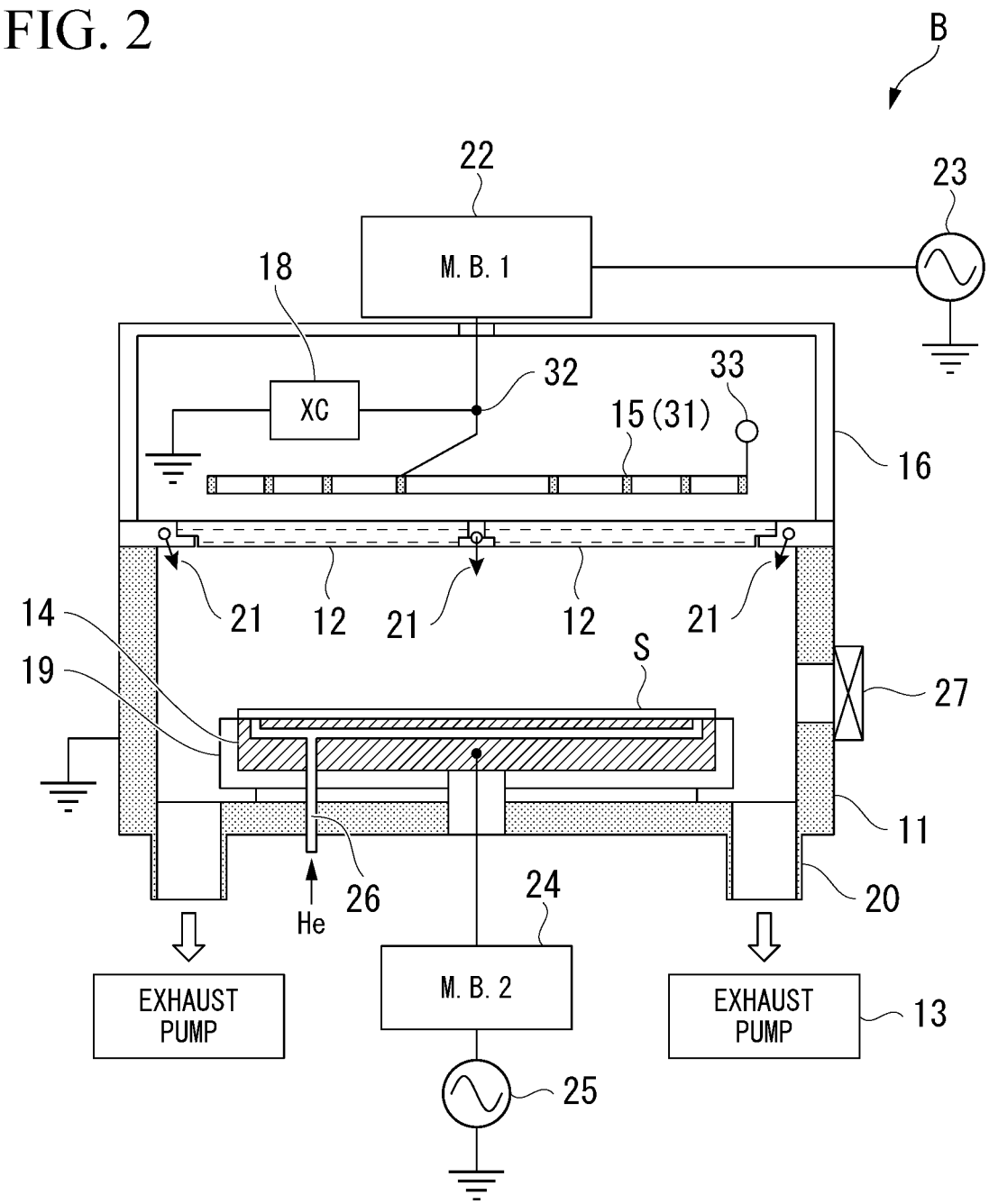
FIG. 2 is a cross-sectional view showing a plasma processing device according to a first embodiment of the present invention.

FIG. 1 is a cross-sectional view showing an inductive coupling type plasma processing device A having a basic structure, and FIG. 2 is a cross-sectional view showing an inductive coupling type plasma processing device B according to a first embodiment of the present invention.

The plasma processing devices A and B are plasma processing devices that perform processing, such as dry etching due to plasma, in a process of manufacturing a flat panel display such as a Liquid Crystal Display (LCD) or an Organic EL Display (OLED).

The plasma processing devices A and B each includes a vacuum container 11, a dielectric window 12, an exhaust pump 13, a second electrode (lower electrode) 14, a first electrode (inductive coupling antenna) 15, and a high frequency shield 16. The vacuum container 11 is made of metal and can control an internal pressure. The dielectric window 12 is provided on an upper surface of the vacuum container 11, and transmits electromagnetic waves. The exhaust pump 13 exhausts an inside of the vacuum container 11 so that the pressure can be maintained at a desired degree of vacuum, for example, approximately 0.1 to 100 Pa. The lower electrode 14 is made of a conductive material, such as aluminum, which is provided in the vacuum container 11, and on which a substrate (an object to be processed) S for performing plasma processing is placed on the upper surface (one main surface). The inductive coupling antenna 15 includes an antenna for forming an inductive coupling arranged above the dielectric window 12 to correspond to the lower electrode 14. The high-frequency shield 16 is made of a metallic conductive material, such as aluminum, that covers a periphery of the antenna.

The dielectric window 12 transmits electromagnetic waves radiated from the inductive coupling antenna 15, radiates the electromagnetic waves into the vacuum container 11, and forms high-density plasma in the vacuum container. The dielectric window 12 is made of a dielectric material such as quartz or ceramics.

The vacuum container 11 is provided with a processing gas introduction port 21 for introducing a processing gas into the vacuum container 11, and the processing gas introduction port 21 is connected with supply means (not shown) of various gases suitable when executing the plasma processing on a substrate to be processed. Various processing gases are introduced into the vacuum container 11 from the processing gas introduction port 21, so that it is possible to perform adjustment to an optimum pressure for each processing condition by an automatic pressure adjusting valve (not shown) for adjusting the inside of the vacuum container 11 to a desired pressure.

Since the exhaust pump 13 is connected to a bottom of the vacuum container 11 via an exhaust pipe 20, an inside of the vacuum container 11 can be exhausted, and the pressure of the vacuum container 11 during the plasma processing can be adjusted and maintained at a set desired pressure. A gate valve 27 is provided on a side wall of the vacuum container 11, so that the substrate S can be carried in.

In addition, a high-frequency power of approximately 1 to 100 MHz is supplied to the second electrode (lower electrode) 14 from a second high-frequency (RF) power source 25 for bias via a second matching box (matching unit for bias) 24. An insulating member 19 is provided around the lower electrode 14 to maintain insulation between the lower electrode 14 and the vacuum container 11.

The inductive coupling antenna 15 radiates a high frequency electromagnetic wave into the vacuum container 11 to excite, dissociate, and ionize the plasma at desired processing gas and desired processing pressure, thereby generating high-density plasma.

Figure 3:
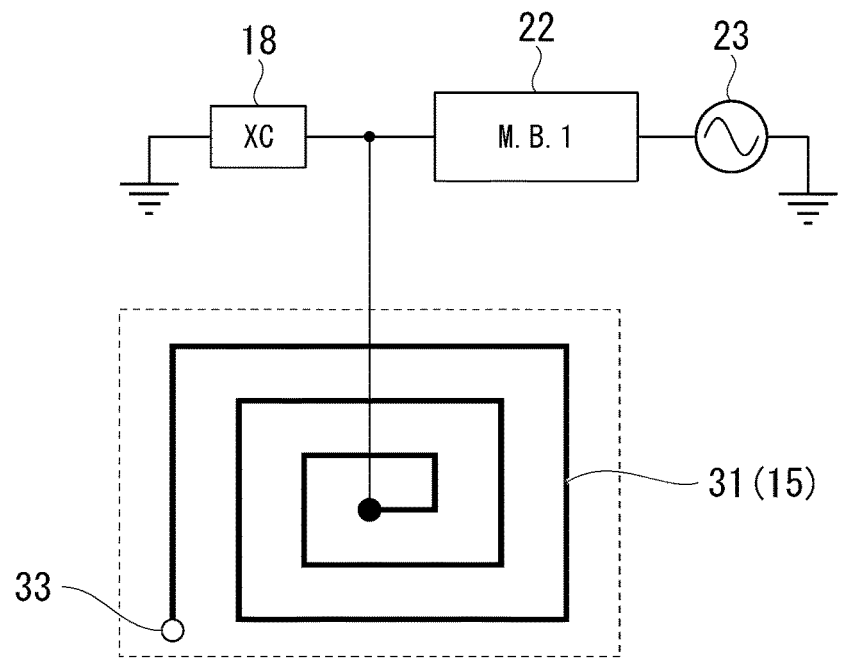
FIG. 3 is a diagram showing an example of a terminal open-end antenna provided in the plasma processing device according to the first embodiment of the present invention.

As shown in FIG. 3, the inductive coupling antenna 15 includes, for example, a planar coil antenna 31 made of a conductive material such as a copper plate. In a basic structure of the inductive coupling antenna 15, one end of the antenna coil is connected to the first matching box (ICP matching unit) 22 as shown in FIG. 1. On the other hand, the other end of the antenna coil (antenna terminal end side) is connected to a GND potential directly or via a variable capacitor 34 shown in FIG. 1. The first matching box 22 is supplied with a high-frequency (RF) power of approximately 1 MHz to 40 MHz from a first high-frequency (RF) power source 23, and RF power is supplied to the inductive coupling antenna 15 via the first matching box 22.

An inside of the lower electrode 14 is equipped with a He gas passage for supplying a heat transfer gas (He or the like) for cooling on a back surface of the substrate S which is the object to be processed. The lower electrode 14 can suppress temperature rise of the substrate S during the plasma processing by introducing a heat transfer gas, such as He, from an He gas introduction portion 26. A DC voltage electrode (not shown) for substrate adhesion is provided between the lower electrode 14 and the substrate S. In a case where a DC voltage is applied, it is possible to adhere the substrate S and to improve the cooling efficiency of the substrate.

In a process of manufacturing the display devices, such as the Liquid Crystal Display (LCD) or the Organic EL display (OLED), the following processing is performed to perform the plasma processing using the plasma processing devices A and B. First, the gate valve 27 is opened, and, next, the substrate S which is the object to be processed is carried in the vacuum container 11 from a not-shown vacuum transfer chamber by a substrate transfer robot.

Next, the substrate S is transferred onto a substrate placing stand on a surface of the lower electrode 14 by a substrate reception and delivery mechanism (not shown). The gate valve 27 is closed, and the processing gas is introduced from the processing gas introduction introduction port 21. Next, while exhausting is performed in the exhaust pump 13, the inside of the vacuum container 11 is adjusted and maintained at a desired pressure, for example, approximately 0.1 to 100 Pa. Next, the high frequency is applied to the antenna 15 by the first high-frequency power source 23. At this time, the electromagnetic wave is radiated from the inductive coupling antenna (first electrode) 15 through the dielectric window 12 into the vacuum container 11, and plasma is generated in the vacuum container 11. The plasma processing gas dissociates in the plasma to become chemically active radicals and ionized ions, and performs the plasma processing on the substrate S which is an object to be processed.

In the inductive coupling type plasma processing device A (FIG. 1) having the basic structure, a coil antenna 31 and the antenna terminal end side variable capacitor 34 are connected in series in the inductive coupling antenna 15. Further, in the inductive coupling type plasma processing device A (FIG. 1) having the basic structure, the inductive coupling antenna 15 is connected to GND via the antenna terminal end side variable capacitor 34.

An RF potential ($V_{0-P}'$) on an RF feeding portion side of the coil antenna 31 in a case of the plasma processing is shown by the following Equation (2). In Equation (2), I' represents a current flowing through the coil antenna 31 when the high-frequency power is fed to the coil antenna 31 by the first high-frequency power source 23. In Equation (2), ω represents the angular frequency of the supplied high-frequency power. In Equation (2), L1 represents self-inductance of the coil antenna 31. In Equation (2), C1 represents electrostatic capacitance of the capacitor 34 connected in series with the coil antenna 31.

[Equation 2]

$$V_{0-P}' = \{\omega \cdot L1 - 1 \div (\omega \cdot C1)\} \times I' \qquad \text{Equation (2)}$$

Figure 5:
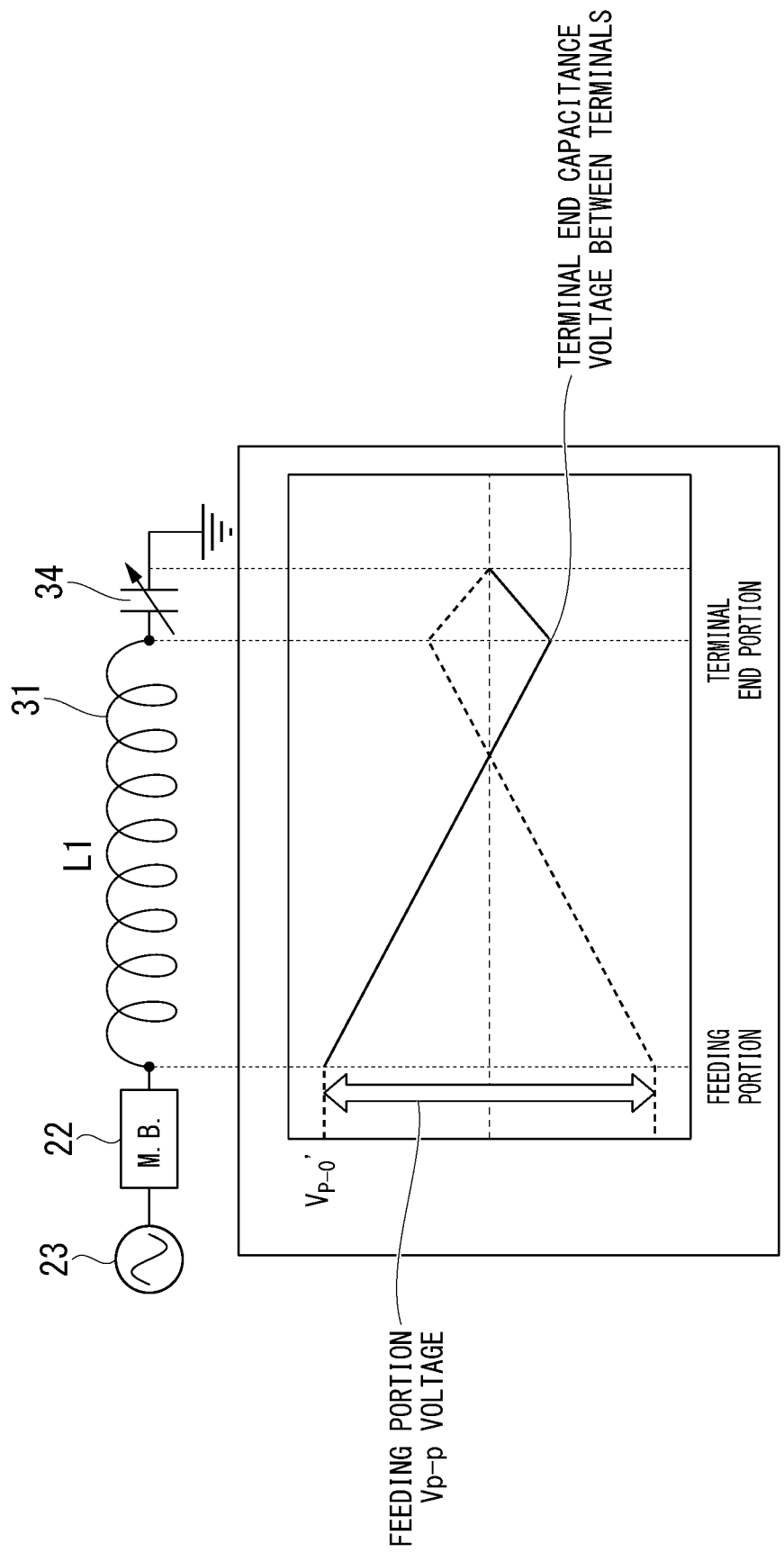
FIG. 5 is a diagram showing a potential distribution of an antenna coil when an inductive coupling type antenna according to the related art is used.

FIG. 5 represents an image of an RF potential distribution of the coil antenna 31 in the coil antenna 31 and the capacitor 34 connected in series to the coil antenna 31 when the plasma processing is performed.

The capacitor 34 is connected in series to another end portion of the coil antenna 31, and, subsequently, connected to a ground potential. Therefore, it is possible to decrease the RF potential ($V_{0-P}'$) of the RF feeding portion of the coil antenna 31 to a potential corresponding to capacitance of the capacitor.

However, as the coil antenna 31 becomes larger and a length of the coil antenna 31 becomes longer, the self-inductance L of the coil antenna 31 also increases proportionally. Therefore, there is a limit to the decrease in the RF potential ($V_{0-P}'$) of the coil antenna 31 due to the capacitance of the capacitor in series, and there is a problem in that the RF potential of the coil antenna 31 increases.

(Description of Effect of Coil Antenna Terminal End Portion Open End)

The plasma processing device B according to the first embodiment of the present invention is shown in FIG. 2. In FIG. 2, the coil antenna 31 has one end (antenna RF input portion 32) connected to the first high-frequency power source 23 via the matching circuit inside the first matching box 22, and the other end is connected to the open end 33. In addition, an impedance adjustment circuit 18 is connected to a one end side of the coil antenna 31 so as to be in parallel to a high-frequency power supply side.

In a case where the terminal end portion of the coil antenna 31 is used as the open end 33, the RF potential of the coil antenna 31 becomes a state like an antinode at an open end part. Therefore, an RF potential V increases at the open end part, and it is possible to reduce an RF potential $V_{P-0}''$ at the coil antenna feeding portion to be equal to or less than approximately ⅓ as compared with a case where the ground potential is connected to the coil antenna 31 in series via the capacitor 34 as in the related art. This is clarified from a test result which will be described later.

Figure 6:
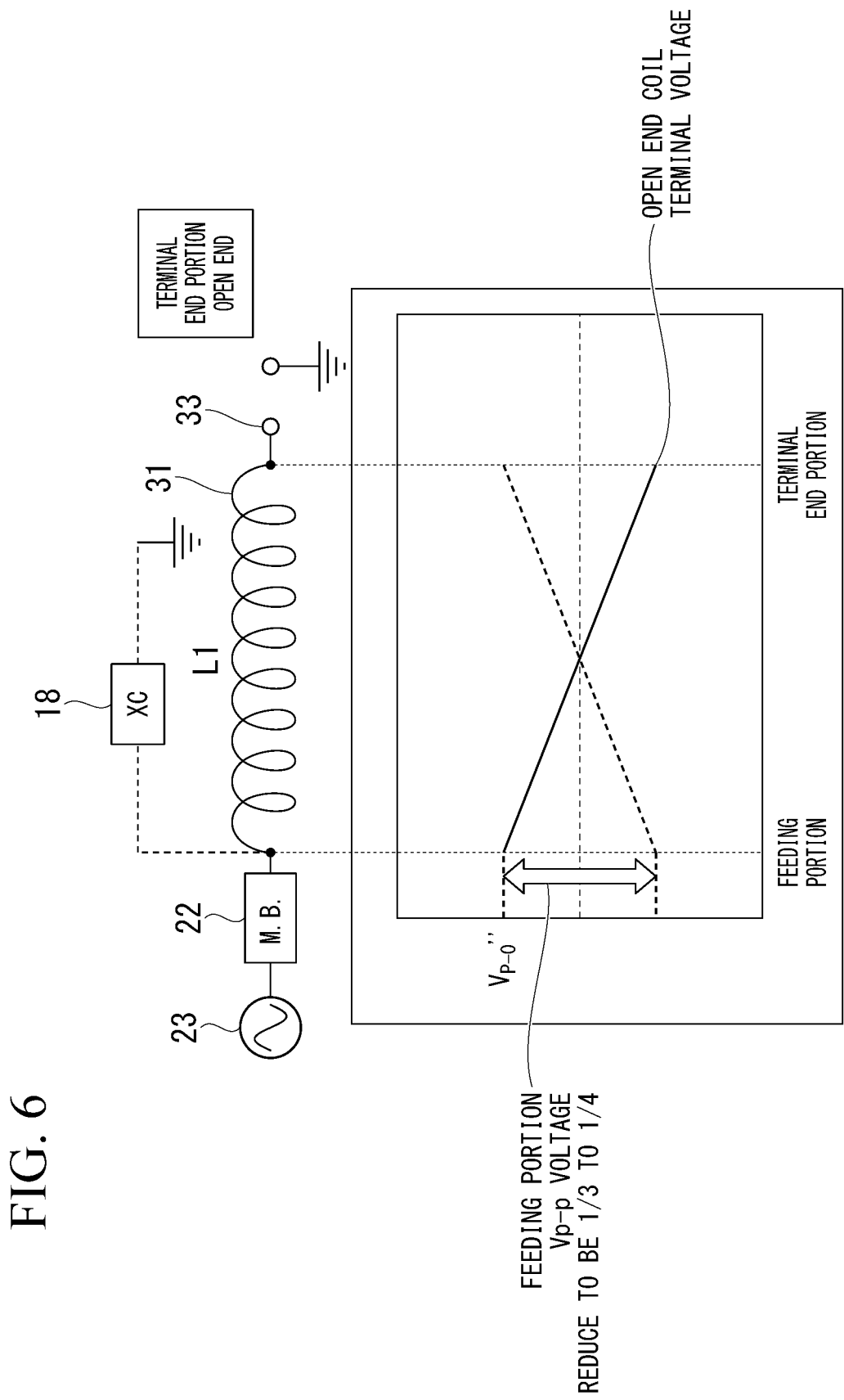
FIG. 6 is a diagram showing a potential distribution of an antenna coil when a terminal open-end antenna element according to the first embodiment of the present invention and a parallel impedance adjustment circuit (variable capacitor) are used.
Figure 7:
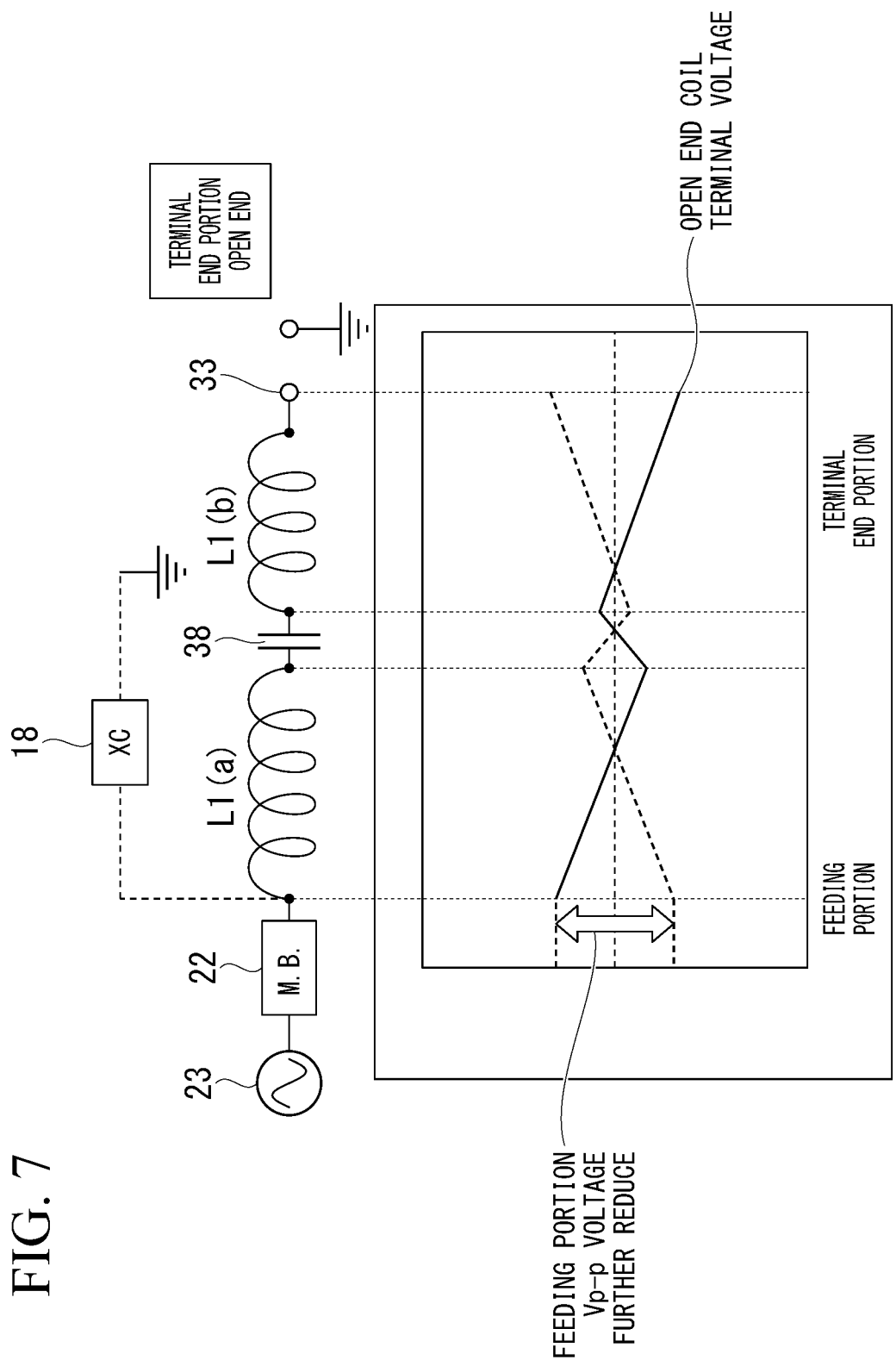
FIG. 7 is a diagram showing a potential distribution of the antenna coil when a capacitor is further added to a terminal open-end antenna coil in series in another form.

FIG. 6 represents an image of the RF potential distribution of the coil antenna 31 in the coil antenna 31 and the antenna terminal end portion open end 33.

In addition, Table 1 below represents actual measurement values of an RF potential $V_{0-P}''$ in a processing device of Example 1 and an RF potential $V_{0-P}''$ in the basic type processing device when the RF power is supplied to the coil antenna 31 and the plasma is generated. The RF potential $V_{0-P}''$ in the processing device of Example 1 is the RF potential $V_{0-P}''$ in the coil antenna feeding portion in the plasma device A (Example 1) having the basic structure. The RF potential $V_{0-P}''$ in the basic type processing device is the RF potential $V_{0-P}''$ in the plasma processing device B (basic type) of the first embodiment of the present invention.

device. In addition, from the results in Table 1, it is understood that the device of Example of the present invention suppresses abrasion of the dielectric window 12 under the coil antenna due to ion attack from the plasma, and can reduce the amount of foreign matter (particles) generated by the ion attack of the dielectric window 12.

Actually, in order to compare the amount of abrasion due to the ion attack from the plasma of the dielectric window under the antenna, an evaluation glass chip is attached and the amount of abrasion of the $SiO_2$ film due to the ion attack from the plasma is evaluated. The evaluation glass chip is a glass substrate in which a thin film of the silicon oxide ($SiO_2$) is attached to a surface thereof. In a case of the evaluation, the evaluation glass chip is attached to the inside of the vacuum container 11 on a side of the vacuum container (under the dielectric window 12) exposed to the plasma of the dielectric window 12.

Figure 8:
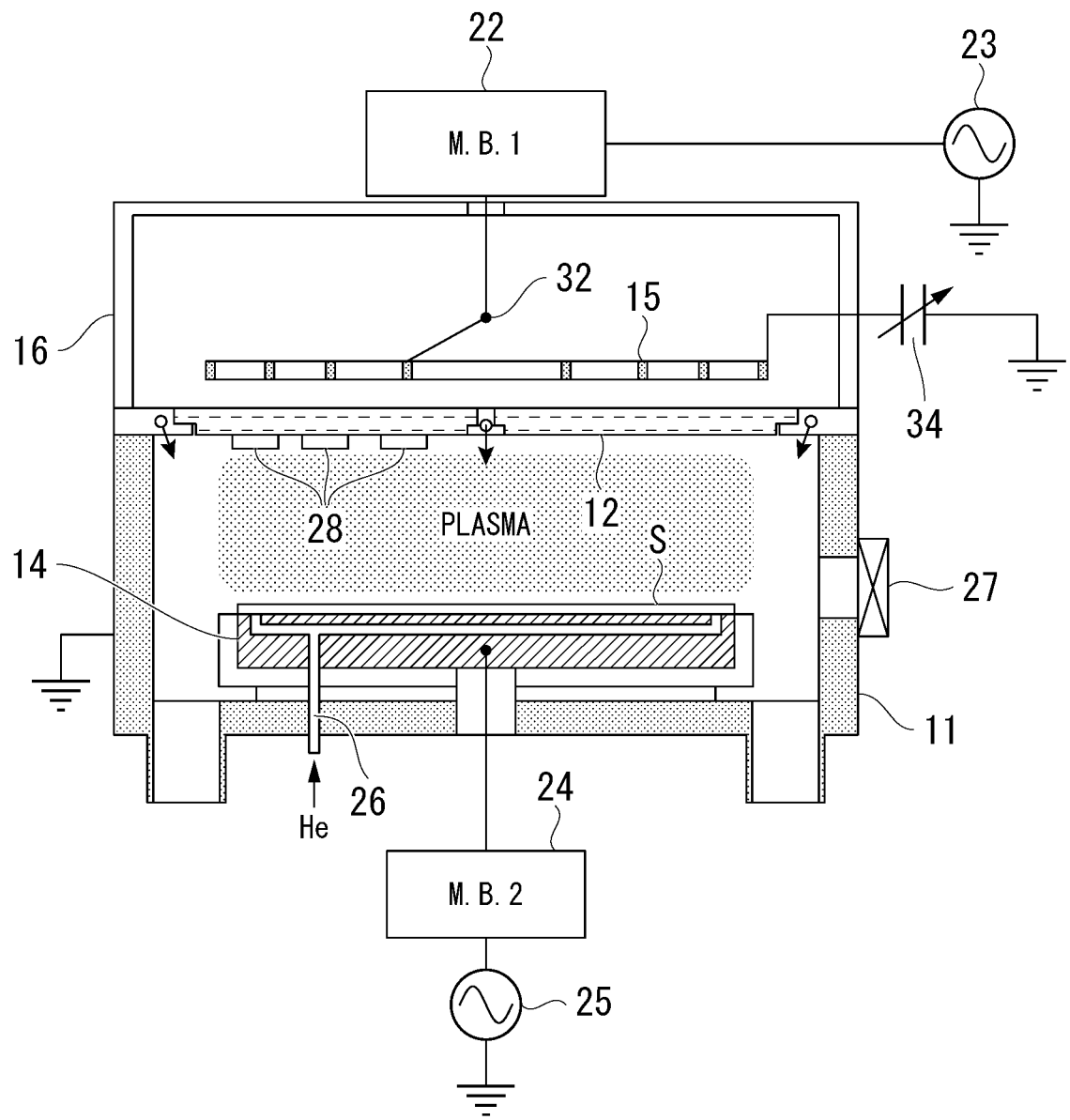
FIG. 8 is a cross-sectional view showing the plasma processing device applied to when the same terminal end portion open-end antenna coil is used and when a result of comparison of the amount of abrasion of an evaluation chip of an $SiO_2$ oxide film installed under a ceramic dielectric window is measured in an antenna structure according to the related art.

Details thereof are shown in FIG. 8 and Table 2 below.

TABLE 2

| (Processing condition) $SiO_2$ etching condition | Amount of abrasion of $SiO_2$ film on glass substrate S which is object to be processed and is placed above lower electrode 14 (nm/minute) | Amount of abrasion of glass chip which is installed under dielectric window 12 and to which $SiO_2$ film for abrasion amount evaluation is attached (nm/minute) |
|---|---|---|
| Basic type inductive coupling plasma processing device | 269.3 | 110.7 |
| Inductive coupling plasma processing device of Example 1 | 270.9 | 15 |

The results shown in FIG. 8 and Table 2 represent that, in Example of the present invention, the amount of abrasion (etching rate) of the evaluation $SiO_2$ under the dielectric window is reduced to 13.5% as compared with the basic type inductive coupling plasma processing device. In addition, the results shown in FIG. 8 and Table 2 also represent that

TABLE 1

| RF power | Processing pressure 10 mTorr | | Processing pressure 20 mTorr | | Processing pressure 30 mTorr | |
|---|---|---|---|---|---|---|
| [W] | Basic type | Example 1 | Basic type | Example 1 | Basic type | Example 1 |
| 2500 | 14853 V | 4327 V | 13035 V | 3613 V | 12170 V | 3376 V |
| 3750 | 17936 V | 5403 V | 16090 V | 4593 V | 15120 V | 4023 V |
| 4750 | >20000 V | 6130 V | 18223 V | 5313 V | 17143 V | 4827 V |

Potential ($V_{P-P}$) feeding portion of coil antenna of basic type processing device and processing device according to Example 1

Results in Table 1 represent that an RF potential ($V_{P-P} = V_{0-P} \times 2$) of the feeding portion of the coil antenna 31 in the plasma processing device of Example 1 of the present invention is significantly reduced to be equal to or less than approximately 30% compared with the RF potential ($V_{P-P} = V_{0-P} \times 2$) of the feeding portion of the coil antenna 31 of the processing device according to the related art.

The results in Table 1 represent that it is possible for the device according to Example of the present invention to perform the description of (4), in which the RF potential of the coil antenna 31 is suppressed to be low, in the above-described requirements for a large scale plasma processing change is not found in the amount of abrasion (etching rate) of the $SiO_2$ thin film of the glass substrate which is the object to be processed.

The results represent that the plasma processing device B can significantly reduce the amount of abrasion of the dielectric window (ceramic or the like) that causes generation of the foreign matters (particles) while maintaining thin film etching processing performance of the glass substrate, which is the object to be processed, by plasma processing.

Also, in execution of the present Example, when high RF power is applied due to an increase in the RF potential in the coil terminal end portion (open end) 33 of the coil antenna 31, there is case where aerial discharge (arcing) is generated. In order to prevent the aerial discharge (arcing), as shown in FIGS. 9A and 9B, a structure is effective in which the terminal end portion (open end) of a coil antenna segment 39 is covered with an insulator 40 such as ceramic or an insulating resin (refer to FIG. 9A). In addition, in order to prevent the aerial discharge (arcing), it is also effective to adopt the structure shown in FIG. 9B. Specifically, the structure shown in FIG. 9B is a structure in which the terminal end portion (open end) of the coil antenna segment 39 is supported by a structure 42 close to the coil antenna via a support member (insulator) 41 made of an insulating material such as ceramic or resin.

Also, as the insulating material for covering the coil antenna segment 39 and the insulating material for supporting the coil antenna segment 39, a material having a low relative dielectric constant (εr) and a low dielectric loss tangent (Tan δ) is preferable. For example, as a resin material, PTFE (trade name: Teflon (registered trademark), εr=2.2, Tan δ=0.0002) or polyetherimide (trade name Ultem et al., εr=3.15, Tan δ=0.0013) is suitable. As a polyimide (trade name: Kapton et al., εr=3.7, Tan δ=0.0013) ceramic material, steatite (εr=5.2 to 6.2, Tan δ=7 to 13e-4), alumina ceramic (εr=9 to 10, Tan δ=4e-4), or the like is suitable.

Next, in the first embodiment, investigation results for the combined impedance of the antenna and the impedance adjustment circuit when the impedance adjustment circuit parallel to the coil antenna is connected to the side of RF feeding side of the coil antenna are shown.

Figure 4:
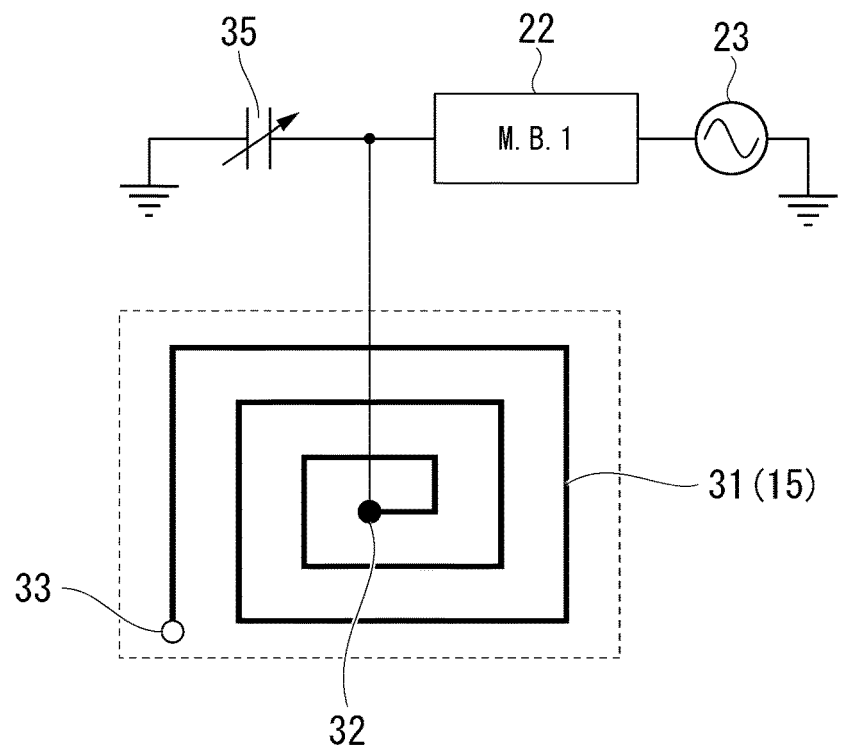
FIG. 4 is a diagram showing an arrangement example of an impedance adjustment circuit (variable capacitor) parallel to the terminal open-end antenna provided in the plasma processing device according to the first embodiment of the present invention.

An example of the investigation results is shown in Table 3 below. Measurement results in Table 3 are measurement results of the combined impedance of the coil antenna and the impedance adjustment circuit when the capacitance of the variable capacitor 35 is changed. In the measurement, as shown in FIG. 4, the variable capacitor 35 is connected to the side of the RF feeding side (antenna RF input portion 32) of the antenna coil 31 whose terminal end portion is the open end, as an impedance adjustment circuit parallel to the antenna coil 31.

TABLE 3

| No. | Capacitance of variable capacitor on input side of coil antenna | Series resistance Rs[Ω] | Series reactance Xs[Ω] | Phase [deg] | Parallel resonance frequency F-pr [MHz] | Series resonance frequency F-sr [MHz] |
|---|---|---|---|---|---|---|
| (1) | 50 pF | 5928 | +10878 | +61.4 | 13.79 | 15.31 |
| (2) | 80 pF | 9.2 | −321.8 | −88.4 | 13.07 | 15.34 |
| (3) | 100 pF | 19.6 | −139.2 | −82.0 | 12.89 | 14.31 |
| (4) | 150 pF | 20.8 | −14.7 | −35.2 | 12.52 | 13.67 |
| (5) | 250 pF | 19.6 | +45.7 | +66.8 | 10.03 | 12.76 |
| (6) | 400 pF | 18.5 | +63.1 | +73.7 | 9.48 | 12.19 |

Value of combined impedance at 13.56 MHz when capacitance of variable capacitor connected in parallel to one coil antenna and input side of coil antenna The measurement results of the combined impedance shown in Table 3 are as follows.

In a case of (1) 50 pF, reactance of the combined impedance is an inductive load.

In a case of (2) 80 pF to (4) 150 pF, a reactance component of the combined impedance is a capacitive load.

In the case of (5) 250 pF to (6) 400 pF, it is shown that reactance component of the combined impedance is the inductive load.

That is, it is understood that the variable capacitor 35 can greatly change the series reactance.

In this way, when the impedance adjustment circuit 18 (variable capacitor 35) parallel to the coil antenna 31 is connected to the side of the RF feeding side (antenna RF input portion 32) of the coil antenna 31, the combined impedance can be adjusted from the inductive load to the capacitive load. Therefore, in such a case, the variable capacitor 35 can adjust the amount of RF current flowing through the coil antenna 31.

The reason for this is that, an impedance of an antenna load viewed from a matching unit 22 is set to an impedance close to a series resonance point from a parallel resonance point, so that the current flowing through the coil antenna 31 can be maximized and the plasma density can be maximized Note that, the parallel resonance point is the maximum impedance of a circulating current from the coil antenna 31 to the parallel variable capacitor 35. Note that, the series resonance point is the maximum impedance of the current flowing into the load. The impedance of the antenna load viewed from the matching unit 22 is realized from the parallel resonance point to the impedance close to the series resonance point by, specifically, adjusting the capacitance of the parallel built-in variable capacitor 35 on the input side of the coil antenna 31.

Note that, in order to obtain the above-described effect, the length of the coil antenna 31 is preferably less than ½ of the wavelength λ of the RF frequency, and further preferably less than ¼ of the wavelength λ. When the length of the coil antenna 31 exceeds the above range, the following problems occur.

1) An RF voltage applied between both ends of the coil antenna 31 (the antenna RF input portion 32 and the open end 33 at the other end) increases, and a problem of the aerial discharge (arcing) easily occurs in the antenna portion close to the open end 33.

2) The RF voltage and the RF current distributed on the antenna become close to a standing wave distribution, and a difference in the amount of abrasion due to the ion attack from the plasma of the dielectric window becomes large in the maximum and minimum parts of the voltage on the antenna. In addition, the difference in plasma intensity generated under the RF current at the maximum and minimum parts becomes large.

3) Unless the capacitance of the variable capacitor 35 of the impedance adjustment means in parallel to the coil antenna 31 is set to a significantly low value (for example: equal to or less than 50 pF), it is not possible to adjust the combined impedance from the parallel resonance point to an impedance close to the series resonance point. Specifically, in a case of a low capacitance capacitor, it is difficult to perform control because influence of parasitic capacitance (stray capacitance) of the antenna itself becomes large.

In order to prevent the above problems, the length of the coil antenna 31 is preferably less than ½ of the wavelength λ of the RF frequency, and further preferably is equal to or less than ¼.

Note that, the length of the coil antenna 31 in this case indicates a total extension length from the RF feeding portion (antenna RF input portion 32) of the antenna to the antenna open end 33 (a length when the coil is extended in one-dimension).

In addition, the intensity of a magnetic field radiated from the antenna is proportional to the number of turns n of the coil. Therefore, as the length of the coil becomes shorter, the number of turns n becomes smaller. Therefore, in a case where the length of the coil antenna 31 is too short, the intensity of the magnetic field radiated from the coil antenna 31 is weakened according to Equation (1) which is Equation described later and indicates the intensity of the magnetic field radiated from the coil antenna 31. As a result, the plasma density decreases. In addition, in order to generate a large area plasma, the coil antenna 31 is required to have a predetermined size (length of a long side and a short side), and, for that purpose, is required to have an antenna length which is equal to or larger than a predetermined value.

Since the RF current flowing through the coil antenna 31 and the intensity of an electromagnetic wave radiated from the coil antenna 31 are in a proportional relationship according to the following Equation (1), the RF electromagnetic wave radiated from the coil antenna 31 becomes strong when the flowing current increases. As a result, the density of the plasma generated under the coil antenna 31 via the dielectric window 12 increases, and conversely, when the RF current decreases, the plasma density generated under the coil antenna 31 becomes weaker.

An intensity H of electric field radiated from the coil antenna is shown by the following Equation (1).

[Equation 3]

$$H = \frac{na^2 I}{2(a^2 + x^2)^{3/2}} \quad \text{Equation (1)}$$

In Equation (1), I represents a current (instantaneous value) flowing through the coil antenna, and the intensity of the magnetic field radiated from the coil antenna is proportional to the current I flowing through the coil antenna. Also, in Equation (1), a represents a radius of the coil antenna, x represents a distance from a center of the coil antenna, and n represents the number of turns of the coil antenna, respectively.

Based on the result, Example of a case will be described below in which, in order to respond to the plasma processing device of a large area substrate, the number of parallel coil antennas is increased and a plasma generating region is widened.

Second Embodiment

Figure 11:
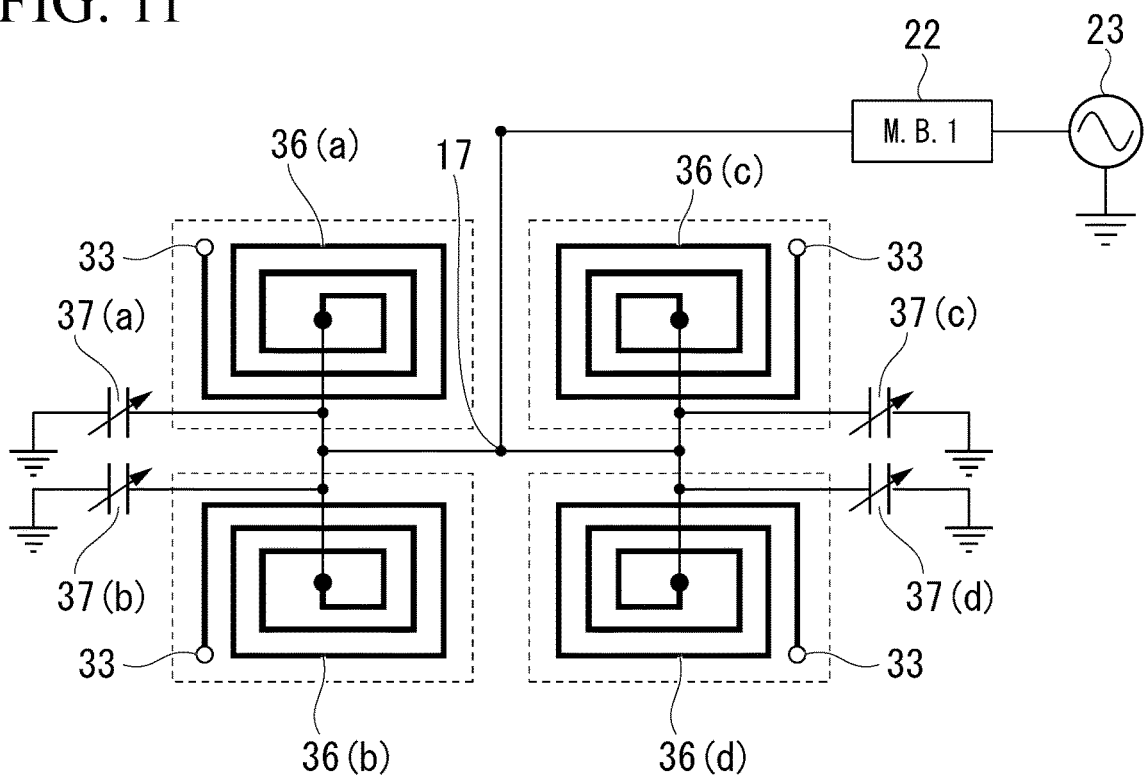
FIG. 11 is a diagram showing an arrangement example of a terminal open-end antenna group (4) provided in a plasma processing device according to a second embodiment of the present invention and impedance adjustment means (variable capacitor) parallel to each antenna.

FIG. 11 is a plan view of a case in which four groups each including the coil antenna 31 of the first embodiment illustrated in FIG. 4 connected in parallel to impedance adjustment means 18 (for example: variable capacitor 35) in parallel to the coil antenna 31 are arranged in parallel. FIG. 11 represents the coil antenna 36 and the variable capacitor 37.

In FIG. 11, the coil antennas 36(a), 36(b), 36(c), and 36(d) are arranged such that the coil antennas adjacent to each other in the front, rear, left, and right are reversely wound with each other.

Hereinafter, an effect due to a fact that the coil antennas adjacent to each other in the front, rear, left, and right are arranged to be reversely wound with each other will be described.

When the plurality of coil antennas 36 are arranged and are simply arranged in the same plane, induced electromagnetic fields generated from the plurality of coil antennas 36(a) to 36(d) interfere with each other, so that the plasma to be generated becomes unstable. In addition, when the winding directions of the coil antennas 36 arranged in a plane are the same winding direction and when power is fed from one high-frequency power source 23 to the plurality of coil antennas 36, directions of the currents flowing through the adjacent coil antennas 36 become opposite directions. Therefore, the induced magnetic fields radiated from the coil antennas 36 act in directions in which the magnetic fields are weakened each other at spots in directions opposite to the current, and there is a tendency that the plasma weakens at the spots.

However, since a winding method of the coil antennas 36 is to be reversely wound in the front, rear, left, and right, the directions of the currents flowing through the adjacent coil antennas 36 are the same, and the induced magnetic fields radiated from the coil antennas 36 act in a direction strengthening each other at spots in directions same as the current. As a result, it is possible to generate a uniform plasma over a large area. Therefore, the coil antennas adjacent to each other in the front, rear, left, and right are arranged to be reversely wound, so that it is possible to respond to the requirement (2) with respect to the large area plasma processing device.

Figure 12:
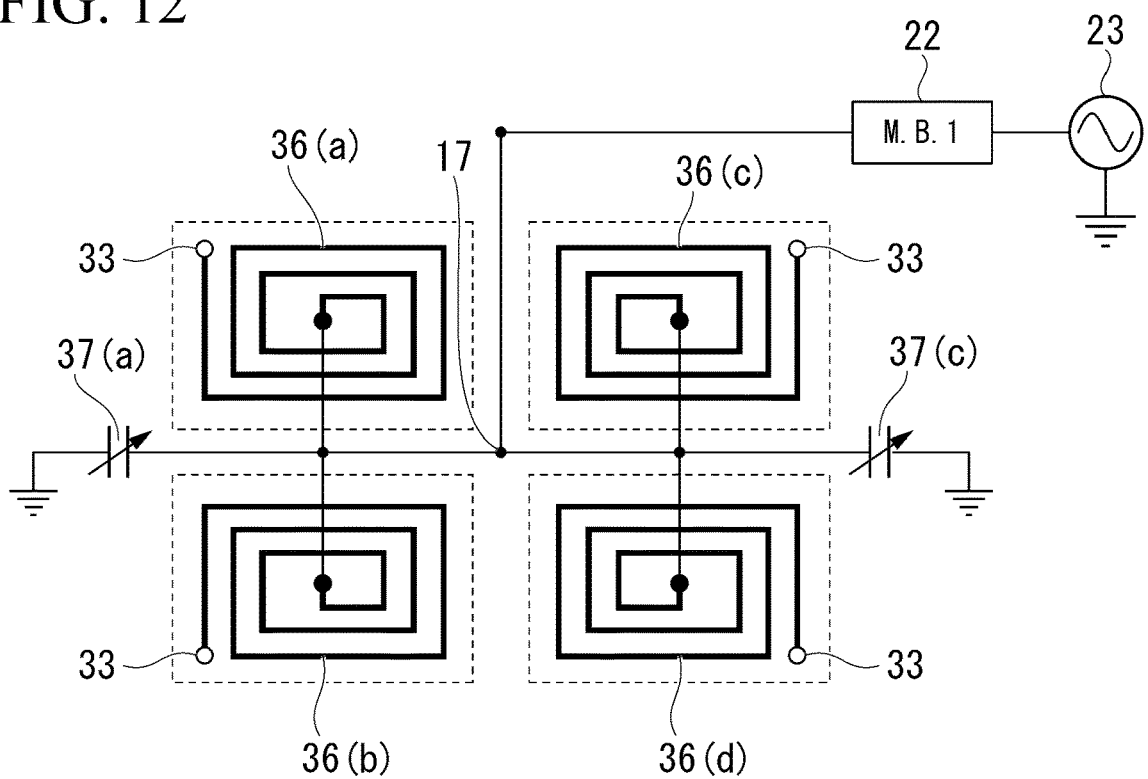
FIG. 12 is a diagram showing an arrangement example when the terminal open-end antenna group (4) provided in the plasma processing device according to the second embodiment of the present invention and one impedance adjustment means (variable capacitor) parallel to every two antennas are installed.

In addition, FIG. 12 is a plan view showing a case in which, with respect to the four coil antennas 36(a) to 36(d) arranged in parallel, one of the two impedance adjustment means (for example: variable capacitors 37) is connected in parallel to the RF input portions of two coil antennas 36. In this way, it is possible to adjust the number of impedance adjustment means (variable capacitors 37) connected in parallel to the coil antennas 36 as needed.

Figure 13:
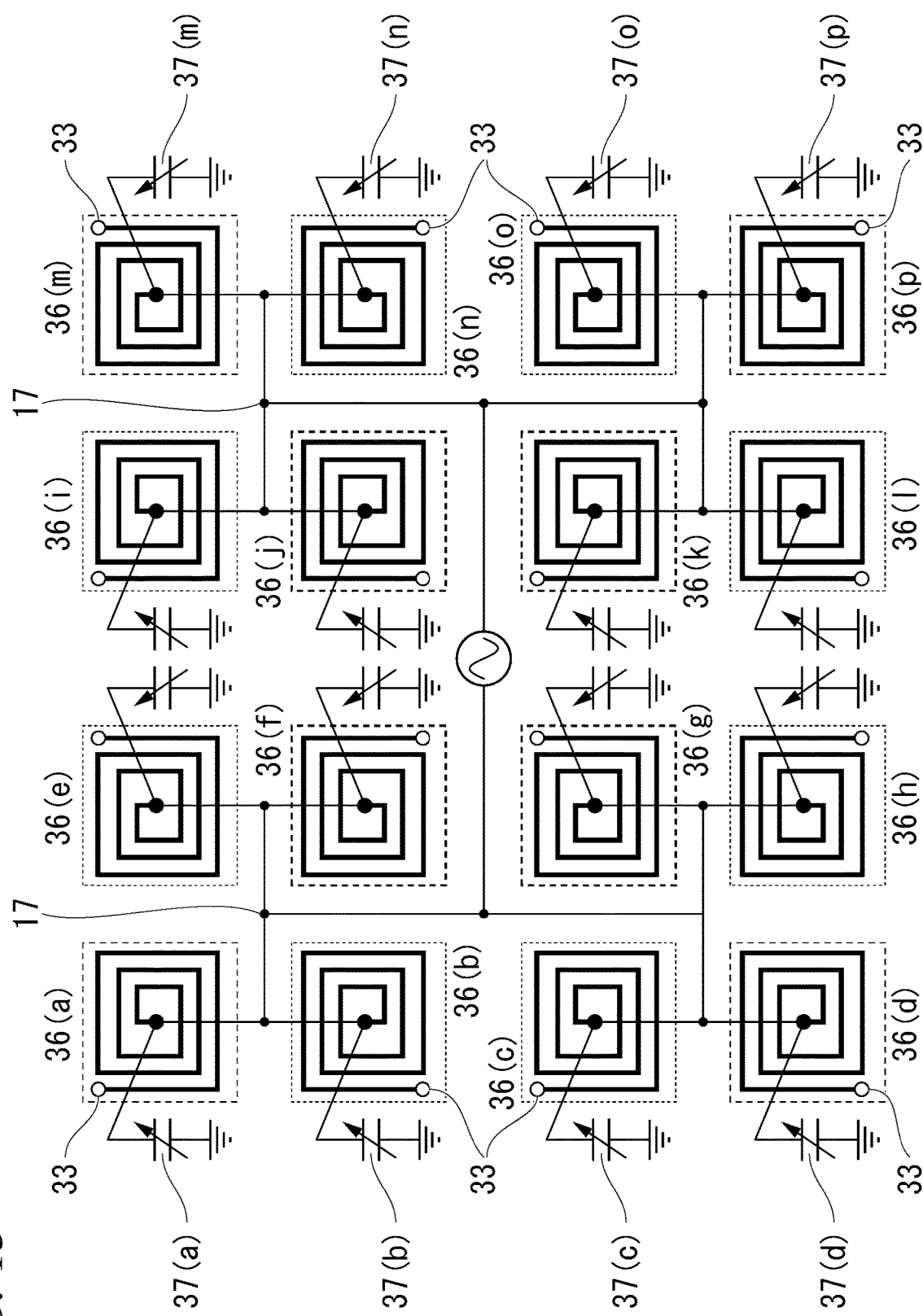
FIG. 13 is a diagram showing an arrangement example when the terminal open-end antenna group (16) provided in the plasma processing device according to the second embodiment of the present invention and impedance adjustment means (variable capacitor) parallel to each antenna are installed.

FIG. 13 is a plan view showing a case where 16 coil antennas 36 and impedance adjustment means (for example: variable capacitors 37) connected parallel to antenna elements are arranged.

The high-frequency power is supplied from a first matching box (not shown) connected to the first high-frequency power source 23 to each of the plurality of coil antennas 36(a) to 36(p) via the RF power distribution path 17.

A plurality of impedance adjustment means (for example: variable capacitors 37(a) to 37(p)) are connected in parallel to the antenna feeding portion.

When impedance of the impedance adjustment means is adjusted, it is possible to freely adjust an in-plane distribution of the plasma in the plasma processing device of the large area substrate. Therefore, it is possible to meet the requirement (3) for the large area plasma processing device.

Figure 14:
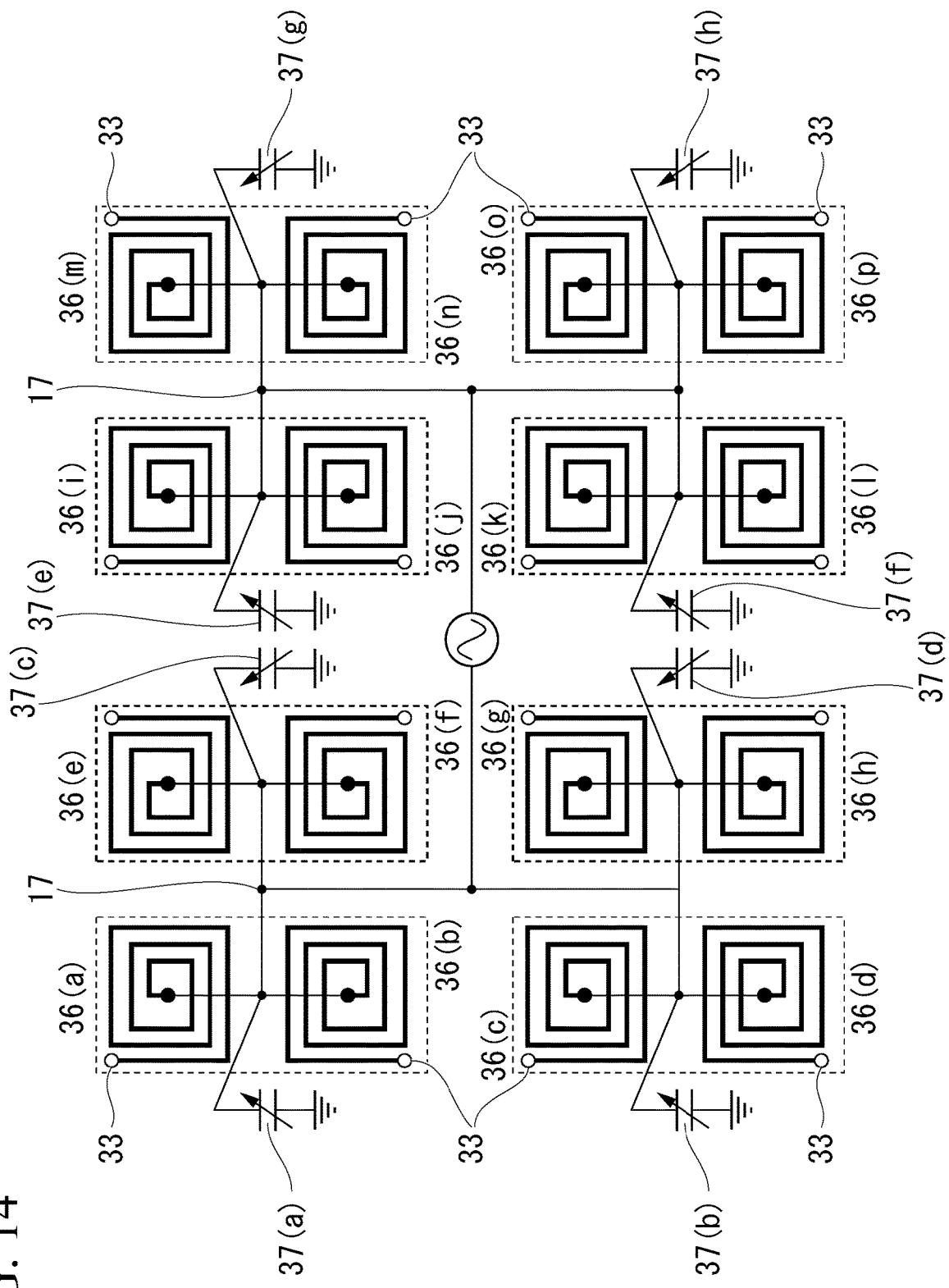
FIG. 14 is a diagram showing an arrangement example when the terminal open-end antenna group (16) provided in the plasma processing device according to the second embodiment of the present invention and one parallel impedance adjustment means (variable capacitor) with respect to two antennas are installed.

FIG. 14 is a plan view showing a case in which, with respect to the four coil antennas 36(a) to 36(d) arranged in parallel, one of the two impedance adjustment means (for example: variable capacitors 37) is connected in parallel to every two RF input portions of the coil antennas 36. As shown in FIG. 14, the number of variable capacitors 37 to be installed may be reduced.

Figure 15:
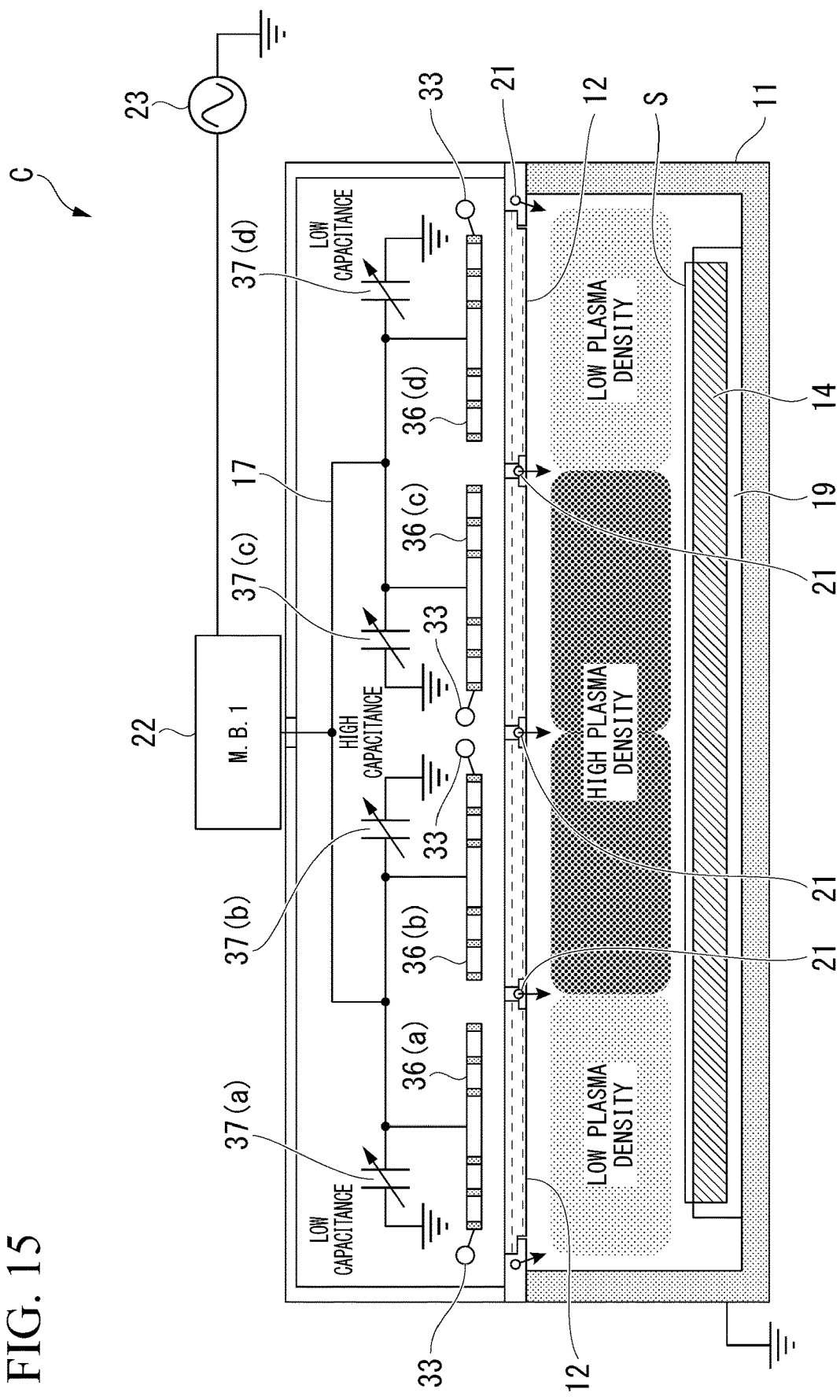
FIG. 15 is a cross-sectional view of the plasma processing device simply showing plasma density distribution adjustment in a state in which the terminal open-end antenna group according to the second embodiment of the present invention and the impedance adjustment means (variable capacitor) parallel to each antenna are installed to perform the impedance adjustment.

FIG. 15 is a cross-sectional view showing a main portion of an inductive coupling type plasma processing device C of the second embodiment. In FIG. 15, the variable capacitor 37 (37(a) to 37(h)) is used as the impedance adjustment means connected in parallel to the coil antenna 36 on the RF input side of the coil antenna 36 (36(a) to 36(d)) whose terminal end portion is the open end 33. Hereinafter, a method for adjusting a plasma distribution will be described with reference to FIG. 15.

Based on the measurement result of the combined impedance shown in Table 3, when the capacitance of the variable capacitor 37 on the antenna element input side is increased from low capacitance to high capacitance, the series reactance component of the combined impedance becomes low. Therefore, when the capacity of the variable capacitor 37 is increased, the current flowing through the coil antenna 36 is larger than the current flowing through the other coil antennas, so that the density of plasma generated under the coil antenna 36 becomes high. That is, it is possible to freely adjust the distribution of the plasma over a large area plasma.

Figure 16:
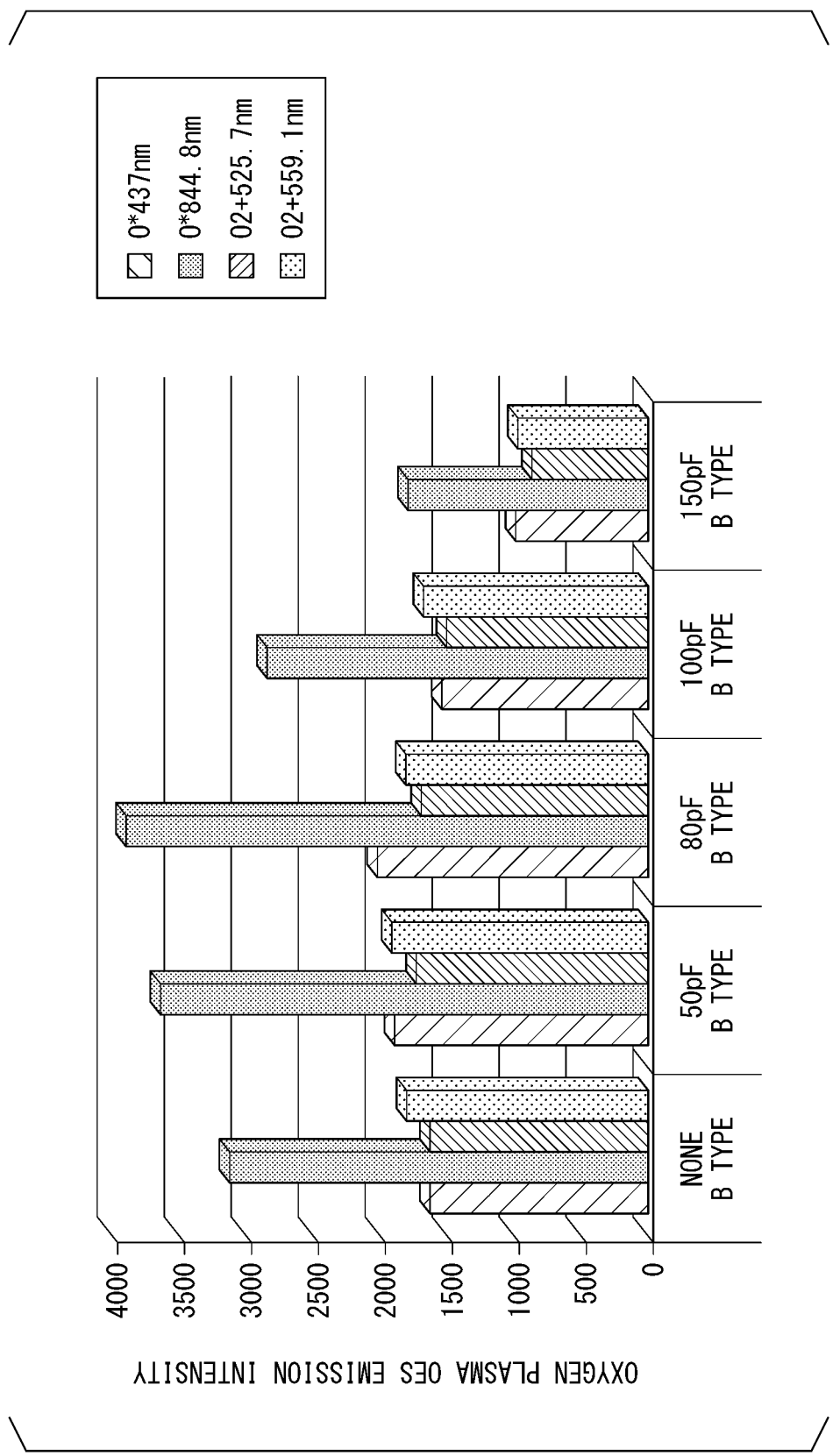
FIG. 16 is graph showing comparison results of an Oxygen plasma Emission Spectroscopy (OES) when an impedance adjustment circuit connected in parallel to an antenna is adjusted in an antenna whose terminal end portion is an open end.

FIG. 16 represents comparison data of emission intensity of plasma emission spectroscopy (OES), obtained when the respective capacitances of the variable capacitors 37(*a*) to 37(*p*) connected in parallel to the coil antennas 36(*a*) to 36(*p*) are changed, in the plasma processing device C (displayed as B type in FIG. 16) of the second embodiment. More specifically, FIG. 16 represents the comparison data of the emission intensity of the plasma emission spectroscopy (OES) at each of wavelengths of oxygen ion ($O^{2+}$) and oxygen radical (O*) in oxygen plasma.

FIG. 16 represents that, when each capacitance of the variable capacitors 37(*a*) to 37(*p*) (all of which have the same capacitance) is 80 pF, the emission intensity at the wavelength of the oxygen radical O* (844.8 nm) is the highest. This is presumed that the induced electromagnetic field generated from the coil antenna becomes the strongest under this condition, dissociation of the plasma proceeds, and the number density of oxygen radicals O* in the oxygen plasma increases.

Figure 17:
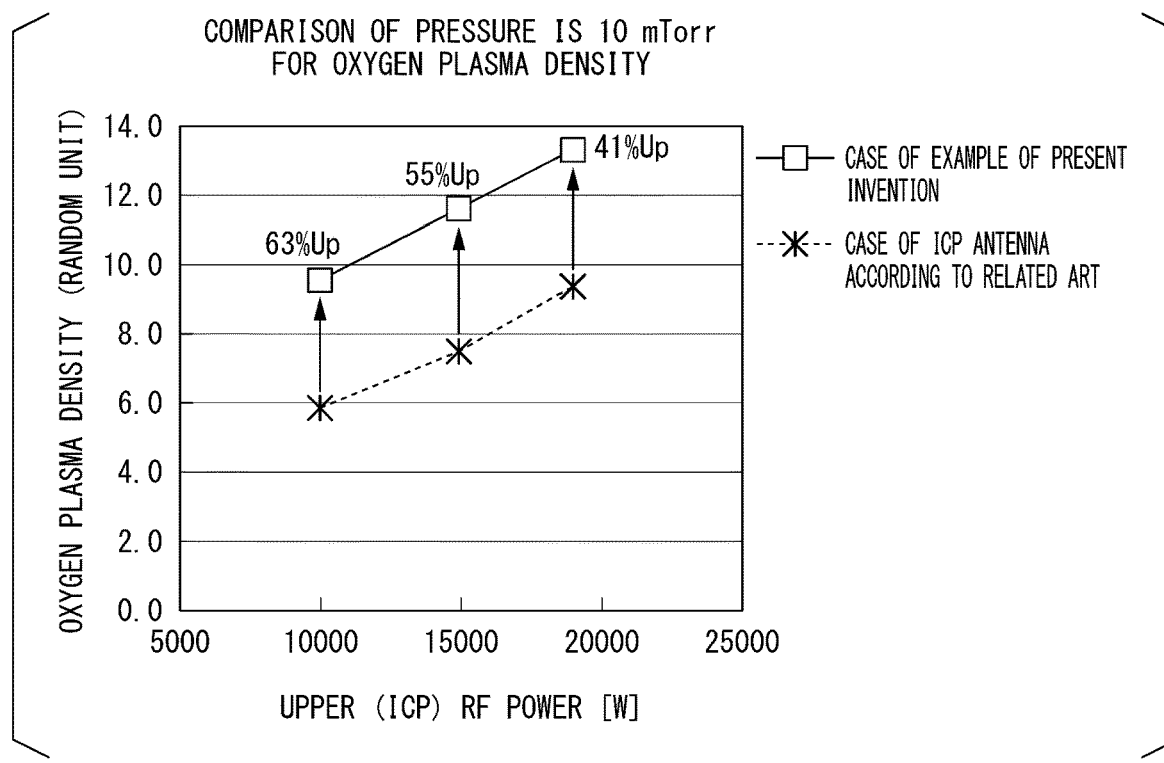
FIG. 17 is a graph showing a comparison result when a pressure is 10 mTorr for an oxygen plasma density in a case of an antenna structure of Example 2 and an oxygen plasma density in a case of the antenna structure according to the related art.
Figure 18:
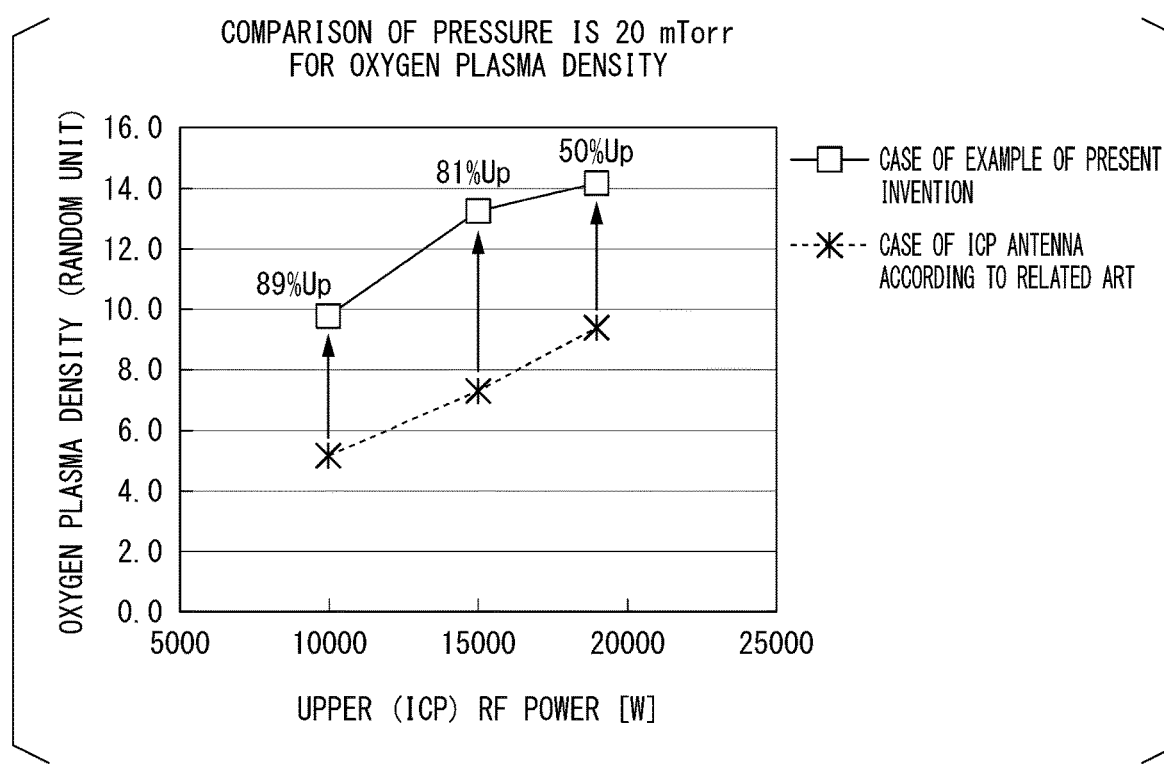
FIG. 18 is a graph showing a comparison result when a pressure is 20 mTorr for the oxygen plasma density in the case of the antenna structure of Example 2 and the oxygen plasma density in the case of the antenna structure according to the related art.
Figure 19:
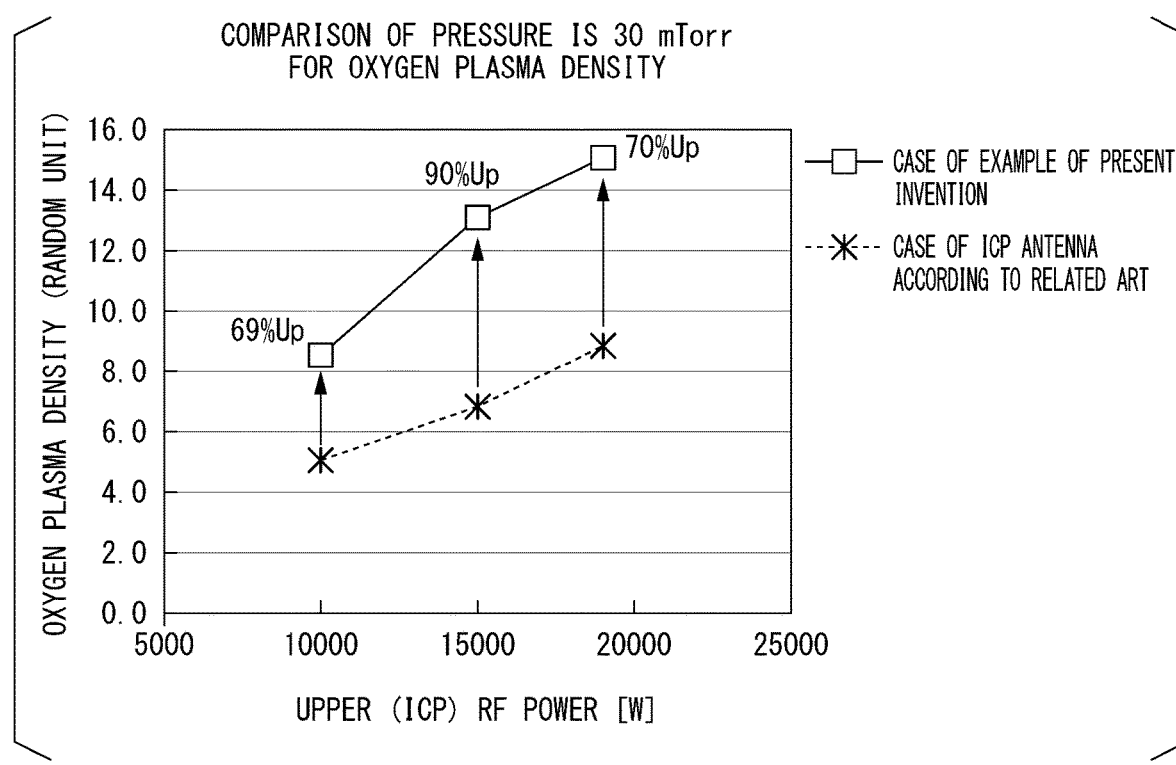
FIG. 19 is a graph showing a comparison result when a pressure is 30 mTorr for the oxygen plasma density in the case of the antenna structure of Example 2 and the oxygen plasma density in the case of the antenna structure according to the related art.

FIGS. 17 to 19 represent measurement results of the oxygen plasma density in the inductive coupling plasma processing device C of the second embodiment and the basic type inductive coupling plasma processing device A. For the measurement of the oxygen plasma, a Langmuir probe is used, and the plasma density generated under the same plasma generation conditions (conditions such as gas flow rate, pressure, and high-frequency power) is compared.

As a result, an increase in the plasma density of the plasma processing device C of the second embodiment, which is 40% or more with respect to the plasma density of the basic type inductive coupling type plasma processing device A, is observed. In particular, under the condition of high processing pressure (20 to 30 mTorr: refer to FIGS. 18 and 19), it is confirmed that, in the plasma density of the embodiment, a plasma density of 90% at maximum increases.

The fact means that the plasma processing device C of the second embodiment is a high-density plasma generation mechanism capable of generating higher density plasma. Therefore, it is possible to respond to the requirement (1) with respect to the large area plasma processing device.

The plasma processing device can set various values in each processing step of a processing recipe for performing the plasma processing. In the adjustment of the impedance adjustment circuit parallel to the coil antenna 36, the plasma processing device may use parameter setting of the impedance adjustment value in which a value of an arbitrary impedance adjustment circuit (for example: the value of the capacitance of the variable capacitor) is set in advance. In such a case, the plasma processing device operates as a processing device capable of selecting the optimum plasma distribution and the plasma intensity in each processing step.

As a result, it is possible to simply adjust the plasma intensity and the density distribution for various plasma processing applications. Therefore, it is possible to respond to the requirement (5) with respect to the large area plasma processing device.

In the plasma processing device, it is possible to install an ammeter capable of measuring an RF current flowing through each coil antenna in the middle of a path from an RF feeding portion of each coil antenna of a coil antenna group to a terminal end open end portion can be provided. As a result, it is possible to adjust the impedance of the impedance adjustment circuit connected in parallel to the coil antenna from the current value of the coil antenna, so that it is possible to secure reproducibility of the plasma distribution adjustment and to shorten the adjustment time.

In addition, when a defect occurs in any of the coil antennas of the coil antenna group or any of the control mechanisms of the impedance adjustment circuit, the defect is detected instantly, the plasma processing of the substrate S is interrupted, and an alarm is issued, so that it is possible to prevent processing failure on the substrate S in advance.

In the plasma processing device, a matching circuit may be provided which can respond to the change of the reactance component of the combined impedance from the capacitive load to the inductive load by the impedance adjustment means connected in parallel to the coil antenna 36 in the present Example.

Figure 20:
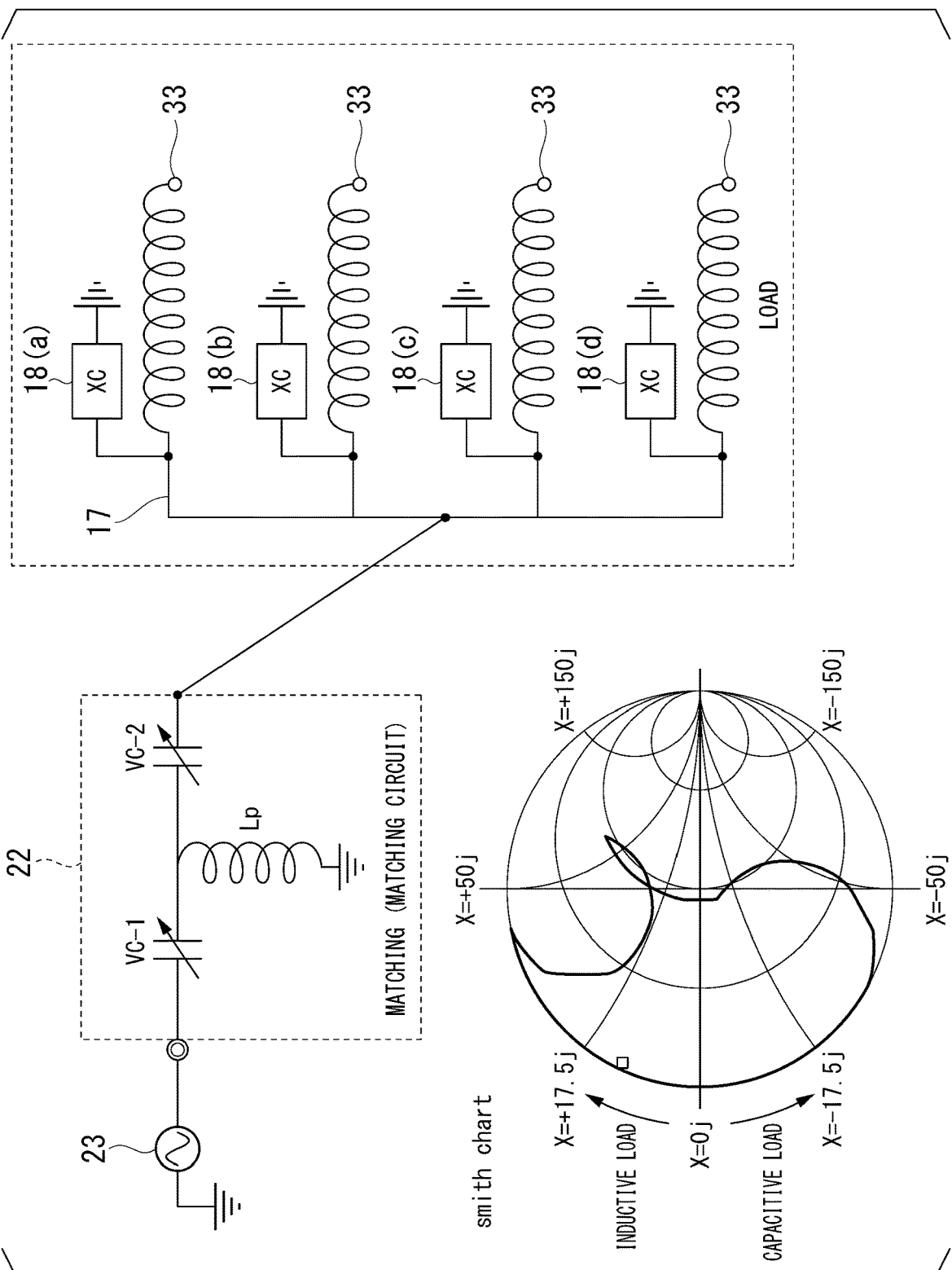
FIG. 20 is a diagram showing an example of an electrical circuit diagram of a T-type matching circuit in a matching circuit used in the embodiment of the present invention.

FIG. 20 represents examples of a matching circuit network when a T-type matching circuit is used as the matching circuit provided in the first matching box 22 and a matching range when an RF high frequency of 13.56 MHz is used.

In the T-type matching circuit, as being understood from a Smith chart shown in FIG. 20, the matching range can cover from the impedance of the capacitive load to the impedance of the inductive load. In the present Example, the T-type matching circuit can respond to a change in the combined impedance changed by the impedance adjustment means 18 connected in parallel. In the T-type matching circuit, a series coil is provided in a main circuit.

In the example shown in FIG. 20, the matching circuit is configured in such a way that an inductance circuit 23 is connected in parallel between variable capacitors VC-1 and VC-2 connected in series.

Figure 21:
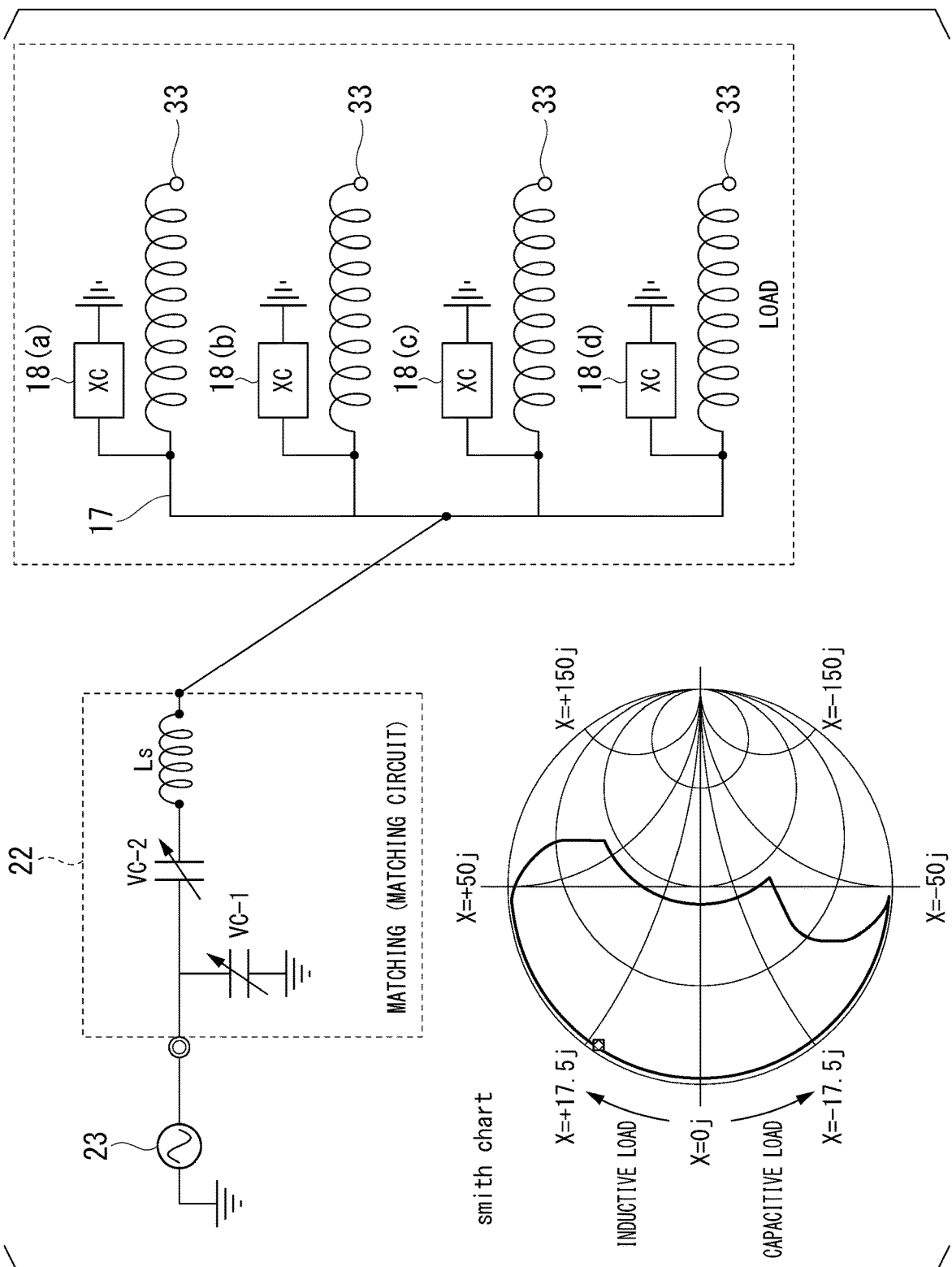
FIG. 21 is a diagram showing an example of an electrical circuit diagram of an inverted L-type matching circuit used in the embodiment of the present invention.

FIG. 21 represents examples of a matching circuit network when an inverted L-type matching circuit (having a series coil in the main circuit) is used as the matching circuit provided in the first matching box 22, and a matching range when an RF high frequency of 13.56 MHz is used.

Also in a case of the inverted L-type matching circuit, as being understood from a Smith chart shown in FIG. 21, the matching range can cover the load impedance from the impedance of the capacitive load to the impedance of the inductive load. The inverted L-type matching circuit in the present Example can provide the plasma processing device capable of responding to the change in the combined impedance.

In the example shown in FIG. 21, the matching circuit is configured in such a way that the variable capacitor VC-1 is connected in parallel to the variable capacitor VC-2 and the inductance circuit 23 connected in series.

REFERENCE SIGNS LIST

A Basic type plasma processing device
B Plasma processing device of embodiment
11 Vacuum container
12 Dielectric window
13 Exhaust pump (vacuum pump)
14 Lower electrode (second electrode)
15 Antenna (first electrode)
16 RF shield
17 RF power distribution path
18 Impedance adjustment circuit on antenna feeding side
19 Lower electrode insulating portion
21 Processing gas introduction port
22 First matching box (matching circuit)
23 First high-frequency (RF) power source
24 Second matching box (matching circuit)
25 Second high-frequency (RF) power source 26 He gas introduction portion
27 Gate valve
31 Coil antenna
32 Antenna RF input portion
33 Antenna terminal end portion (open end)
34 Antenna terminal end side variable capacitor
35 Antenna input side variable capacitor
36a-36p Each coil antenna of assembly antenna
37a to 37p Each input side variable capacitor of assembly antenna
38 Capacitor
39 Coil antenna segment
40 Insulator at antenna open end portion
41 Support member (insulator)
42 Structure close to antenna
S Substrate (object to be processed)
VC-1, VC-2 Variable capacitor

The invention claimed is:

1. A plasma processing device comprising:
a vacuum container that has controllable internal pressure;
a lower electrode that is provided in the vacuum container and has an upper surface on which a substrate is placed; and
an antenna that is arranged to face the lower electrode to form inductive coupling, wherein
the antenna is an assembly antenna in which a plurality of antenna elements are assembled, each including one end which is connected to a high-frequency power source for supplying high-frequency power via a matching circuit, and the other end which is an open end,
a length of the antenna is less than ½λ of a wavelength (λ) of an RF frequency,
an RF power distribution path is provided for distributing and supplying RF power between the matching circuit and the plurality of antennas,
an impedance adjustment circuit parallel to the antennas is connected in parallel to at least one or more antennas between the RF power distribution path and an RF feeding side of each antenna,
a reactance component of a combined impedance by the antennas or the antenna group and the impedance adjustment circuit is adjustable by the impedance adjustment circuit from a capacitive load to an inductive load with respect to the RF frequency supplied to the antennas or the antenna group, and
an ammeter that measures an RF current flowing through each antenna in a middle of a path from an RF feeding portion of each antenna of the antenna group to an open end portion,
wherein an in-plane distribution of a plasma density is controllable by freely adjusting the impedance of the impedance adjustment circuit based on a current value flowing through the antenna and adjusting the current value flowing through the antenna.

2. The plasma processing device according to claim 1, wherein
the impedance adjustment circuit is a variable capacitor, and
the plasma processing device is configured to freely perform plasma distribution adjustment and plasma density adjustment by optimizing capacitance of the variable capacitor according to an application to be used, and adjusting the combined impedance of the impedance adjustment circuit with respect to the RF frequency supplied to the antenna.

3. The plasma processing device according to claim 1, wherein
the antenna that is configured to form the inductive coupling is a spiral-shaped antenna coil, and the number of turns thereof is at least two turns or more.

4. The plasma processing device according to claim 1, wherein
a part of an open end side of the antenna is covered by an insulator for preventing aerial discharge (arcing) due to an increase in electric potential or is supported by a nearby structure via the insulator.

5. The plasma processing device according to claim 1, wherein
adjustment of the impedance adjustment circuit is settable in each processing step of a processing recipe for performing plasma processing, and is settable by setting a parameter of an impedance adjustment value in which a value of an arbitrary impedance adjustment circuit is set in advance.

6. The plasma processing device according to claim 1, wherein the matching circuit includes an inverted L-type matching circuit or a T-type matching circuit, which is suited to respond to a change from the capacitive load to the inductive load with respect to the RF frequency used by the reactance component of the combined impedance.

* * * * *